United States Patent
Goto et al.

(10) Patent No.: US 12,255,613 B2
(45) Date of Patent: *Mar. 18, 2025

(54) MULTI-LAYER PIEZOELECTRIC SUBSTRATE WITH CONDUCTIVE LAYER

(71) Applicant: Skyworks Solutions, Inc., Irvine, CA (US)

(72) Inventors: Rei Goto, Osaka (JP); Keiichi Maki, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/303,012

(22) Filed: Apr. 19, 2023

(65) Prior Publication Data

US 2023/0370044 A1 Nov. 16, 2023

Related U.S. Application Data

(63) Continuation of application No. 16/723,819, filed on Dec. 20, 2019, now Pat. No. 11,671,072.

(Continued)

(51) Int. Cl.
*H03H 9/02* (2006.01)
*H03H 3/08* (2006.01)
(Continued)

(52) U.S. Cl.
CPC .......... *H03H 9/02913* (2013.01); *H03H 3/08* (2013.01); *H03H 9/02559* (2013.01);
(Continued)

(58) Field of Classification Search
CPC .. H03H 9/02913; H03H 3/08; H03H 9/02559; H03H 9/02574; H03H 9/02834;
(Continued)

(56) References Cited

U.S. PATENT DOCUMENTS 5,426,340 A 6/1995 Higaki et al.
5,554,960 A 9/1996 Ohnuki et al.
(Continued)

FOREIGN PATENT DOCUMENTS

JP S52-050033 U 4/1977
JP H06-002823 U 1/1994
(Continued)

OTHER PUBLICATIONS

Schoonderbeek, "Via hole plugging—what is it and when can it be used", NCAB Group, Newsroom, https://www.ncabgroup.com/blog/via-hole-plugging-what-is-it-and-when-can-it-be-used/, (2021).

*Primary Examiner* — Rakesh B Patel
*Assistant Examiner* — Jorge L Salazar, Jr.
(74) *Attorney, Agent, or Firm* — Knobbe, Martens, Olson & Bear, LLP

(57) ABSTRACT

An acoustic wave device is disclosed. The acoustic wave device can include a piezoelectric layer positioned over a substrate. The acoustic wave device can also include an interdigital transducer electrode positioned over the piezoelectric layer. The acoustic wave device can also include a grounding structure positioned over the piezoelectric layer. The acoustic wave device can also include a conductive layer positioned under the substrate such that the substrate is positioned between the conductive layer and the grounding structure. The acoustic wave device can further include an electrical pathway that electrically connects the conductive layer to the grounding structure.

20 Claims, 23 Drawing Sheets

Related U.S. Application Data

(60) Provisional application No. 62/785,011, filed on Dec. 26, 2018.

(51) Int. Cl.
| | | |
|---|---|---|
| *H03H 9/13* | (2006.01) | |
| *H03H 9/54* | (2006.01) | |
| *H03H 9/64* | (2006.01) | |
| *H03H 9/72* | (2006.01) | |
| *H10N 30/05* | (2023.01) | |
| *H10N 30/50* | (2023.01) | |
| *H10N 30/87* | (2023.01) | |

(52) U.S. Cl.
CPC .... *H03H 9/02574* (2013.01); *H03H 9/02834* (2013.01); *H03H 9/131* (2013.01); *H03H 9/54* (2013.01); *H03H 9/6406* (2013.01); *H03H 9/725* (2013.01); *H10N 30/05* (2023.02); *H10N 30/50* (2023.02); *H10N 30/87* (2023.02)

(58) Field of Classification Search
CPC ........ H03H 9/131; H03H 9/54; H03H 9/6406; H03H 9/725; H03H 9/0542; H03H 9/059; H10N 30/05; H10N 30/50; H10N 30/87
USPC .......................................... 333/133, 193–196
See application file for complete search history.

(56) References Cited

U.S. PATENT DOCUMENTS

| | | |
|---|---|---|
| 6,037,698 A | 3/2000 | Ueda et al. |
| 11,671,072 B2 | 6/2023 | Goto et al. |
| 11,677,377 B2 | 6/2023 | Goto et al. |
| 2009/0189483 A1 | 7/2009 | Kadota et al. |
| 2010/0127799 A1 | 5/2010 | Bauer et al. |
| 2013/0321100 A1 | 12/2013 | Wang |
| 2014/0312994 A1 | 10/2014 | Meltaus et al. |
| 2016/0380176 A1* | 12/2016 | Kishino ................. H03H 9/725 370/282 |
| 2017/0288629 A1 | 10/2017 | Bhattacharjee et al. |
| 2018/0034439 A1 | 2/2018 | Ruby et al. |
| 2018/0048285 A1* | 2/2018 | Nishimura ........... H03H 9/2452 |
| 2020/0106416 A1 | 4/2020 | Iwamoto |
| 2020/0212875 A1 | 7/2020 | Goto et al. |
| 2020/0212883 A1 | 7/2020 | Goto et al. |

FOREIGN PATENT DOCUMENTS

| | | |
|---|---|---|
| JP | H06-326553 | 11/1994 |
| JP | 2000-049564 | 2/2000 |
| JP | 2006-180334 A | 7/2006 |
| JP | 2006-211613 | 8/2006 |
| JP | 2006-245990 | 9/2006 |
| JP | 2008-118192 | 5/2008 |
| JP | 4601415 | 12/2010 |
| JP | 2015-091065 | 5/2015 |
| JP | 2017-022501 | 1/2017 |
| JP | 2018-157508 | 10/2018 |
| WO | WO 2017/179300 | 10/2017 |

* cited by examiner

MULTI-LAYER PIEZOELECTRIC SUBSTRATE WITH CONDUCTIVE LAYER

CROSS REFERENCE TO PRIORITY APPLICATION

This application is a continuation of U.S. patent application Ser. No. 16/723,819, filed Dec. 20, 2019, and titled "MULTI-LAYER PIEZOELECTRIC SUBSTRATE WITH CONDUCTIVE LAYER," which claims benefit to U.S. Provisional Patent Application No. 62/785,011, filed Dec. 26, 2018 and titled "MULTILAYER PIEZOELECTRIC SUBSTRATE," the disclosure of which is hereby incorporated by reference in its entirety herein.

TECHNICAL FIELD

Embodiments of this disclosure relate to acoustic wave devices.

DESCRIPTION OF RELATED TECHNOLOGY

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transductor electrode is disposed. Certain surface acoustic wave resonators can include multi-layer piezoelectric substrates.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, an acoustic wave device is disclosed. The acoustic wave device includes a piezoelectric layer over a substrate, an interdigital transducer electrode over the piezoelectric layer, and a grounding structure over the piezoelectric layer. The acoustic wave device also includes a conductive layer positioned between the piezoelectric layer and the substrate. The conductive layer is electrically connected to the grounding structure.

In an embodiment, a via that extends through at least a portion of the piezoelectric layer is included in an electrical path between the conductive layer and the grounding structure. The via can be a filled via filled with a conductive material. The via can be a conformal via.

In an embodiment, conductive material that extends along a sidewall of the piezoelectric layer is included in an electrical path between the conductive layer and the grounding structure.

In an embodiment, the grounding structure includes a plurality of grounding structure portions that are spaced apart from each other.

In an embodiment, the acoustic wave device further includes a temperature compensation layer that is disposed over the interdigital transducer electrode.

In an embodiment, the acoustic wave device further includes a dispersion adjustment layer that is disposed between the piezoelectric layer and the conductive layer. The dispersion adjustment layer can include silicon dioxide.

In an embodiment, the conductive layer includes aluminum.

In an embodiment, the conductive layer has a thickness of between approximately 10 nanometers and approximately 10 microns.

In an embodiment, the grounding structure includes a conductive plate.

In an embodiment, the grounding structure includes conductive pillars.

In one aspect, an acoustic wave filter is disclosed. The acoustic wave filter includes an acoustic wave device. The acoustic wave device includes a piezoelectric layer over a substrate, an interdigital transducer electrode over the piezoelectric layer, a grounding structure over the piezoelectric layer, and a conductive layer that is positioned between the piezoelectric layer and the substrate. The conductive layer is electrically connected to the grounding structure. The acoustic wave filter also includes a plurality of other acoustic wave devices. The acoustic wave device and the plurality of other acoustic wave devices are together arranged to filter a radio frequency signal.

In one aspect, a method of manufacturing an acoustic wave device is disclosed. The method includes providing an acoustic wave device structure that includes a substrate, a conductive layer over the substrate, a piezoelectric layer over the conductive layer such that the conductive layer is positioned between the substrate and the piezoelectric layer, and an interdigital transducer electrode over the piezoelectric layer. The method also includes electrically connecting the conductive layer to a grounding structure that is positioned over the piezoelectric layer to thereby ground the conductive layer.

In an embodiment, the method further includes forming an opening through at least a portion of the piezoelectric layer to expose the conductive layer and providing a conductive material in the opening. The electrically connecting can cause the conductive layer to be electrically connected to the grounding structure by way of the conductive material. The conductive material in the opening can be a filled via or a conformal via.

In an embodiment, the method further includes etching a portion of the piezoelectric layer and providing a conductive material in the etched portion of the piezoelectric layer. The electrically connecting can cause the conductive layer to be electrically connected to the grounding structure by way of the conductive material.

In an embodiment, the method further includes forming a temperature compensation layer over the interdigital transducer electrode.

In an embodiment, the providing includes providing the acoustic wave device structure with a dispersion adjustment layer that is positioned between the piezoelectric layer and the conductive layer.

In one aspect, an acoustic wave device is disclosed. The acoustic wave device includes a piezoelectric layer over a substrate, an interdigital transducer electrode over the piezoelectric layer, and a conductive layer positioned between the piezoelectric layer and the substrate. The acoustic wave device also include a grounding structure that is positioned under the substrate such that the substrate is positioned between the conductive layer and the grounding structure. The conductive layer is electrically connected to the grounding structure.

In an embodiment, a via that extends through at least a portion of the substrate is included in an electrical path between the conductive layer and the grounding structure. The via can be a filled via. The via can be a conformal via.

In an embodiment, a conductive material that extends along a sidewall of the substrate is included in an electrical path between the conductive layer and the grounding structure.

In an embodiment, the grounding structure includes a plurality of grounding structure portions that are spaced apart from each other.

In an embodiment, the acoustic wave device further includes a temperature compensation layer disposed over the interdigital transducer electrode.

In an embodiment, the acoustic wave device further includes an insulating layer disposed between the piezoelectric layer and the conductive layer.

In an embodiment, the interdigital transducer electrode is electrically connected to the grounding structure.

In an embodiment, the conductive layer has a thickness of between approximately 10 nanometers and approximately 10 microns.

In an embodiment, a first via extends from the grounding structure to the conductive structure, and a second via extends from the grounding structure through the conductive layer to the interdigital transducer electrode.

In an embodiment, the acoustic wave device is arranged to generate a surface acoustic wave.

In one aspect an acoustic wave filter is disclosed. The acoustic wave filter includes an acoustic wave device. The acoustic wave device includes a piezoelectric layer over a substrate, an interdigital transducer electrode over the piezoelectric layer, a conductive layer positioned between the piezoelectric layer and the substrate, and a grounding structure positioned under the substrate such that the substrate is positioned between the conductive layer and the grounding structure. The conductive layer is electrically connected to the grounding structure. The acoustic wave filter also include a plurality of other acoustic wave devices. The acoustic wave device and the plurality of other acoustic wave devices are together arranged to filter a radio frequency signal.

In one aspect, a method of manufacturing an acoustic wave device is disclosed. The method includes providing an acoustic wave device structure that includes a substrate, a conductive layer over the substrate, a piezoelectric layer over the conductive layer such that the conductive layer is positioned between the substrate and the piezoelectric layer, and an interdigital transducer electrode positioned over the piezoelectric layer. The method also includes electrically connecting the conductive layer to a grounding structure under the substrate. The substrate is positioned between the conductive layer and the grounding structure.

In an embodiment, the method further includes forming an opening through at least a portion of the substrate and providing a conductive material in the opening. The electrically connecting causes the conductive layer to be electrically connected to the grounding structure by way of the conductive material. The conductive material can form a via extending through the substrate.

In an embodiment, the method further includes forming a temperature compensation layer over the interdigital transducer electrode.

In an embodiment, the providing includes providing the acoustic wave device structure with a dispersion adjustment layer that is positioned between the piezoelectric layer and the conductive layer.

In an embodiment, the electrically connecting also electrically connects the grounding structure and the interdigital transducer electrode.

In an embodiment, after the electrically connecting, a first via extends from the grounding structure to the conductive structure and a second via extends from the grounding structure through the conductive layer to the interdigital transducer electrode.

In another aspect, an acoustic wave resonator includes a piezoelectric layer over a substrate, an interdigital transducer electrode over the piezoelectric layer, a grounding structure over the interdigital transducer electrode, and a conductive layer positioned between the piezoelectric layer and the substrate. The conductive layer is electrically connected to the grounding structure by way of a via extending through at least the piezoelectric layer.

The acoustic wave resonator can be a surface acoustic wave resonator configured to generate a surface acoustic wave.

The acoustic wave resonator can further include a dispersion adjustment layer disposed over the interdigital transducer electrode. Alternatively or additionally, the acoustic wave resonator can include a dispersion adjustment layer disposed between the piezoelectric layer and the conductive layer. A dispersion adjustment layer can include silicon dioxide.

The conductive layer can have a thickness of between approximately 10 nanometers and approximately 10 microns. The conductive layer can include aluminum.

The substrate can be a high velocity substrate. The grounding structure can include a copper plate. The grounding structure can include copper pillars.

The acoustic wave resonator can further include solder pads over the grounding structure.

An acoustic wave filter can include acoustic wave resonators that include any of the acoustic wave resonators disclosed herein. The acoustic wave filter can filter a radio frequency signal.

A wireless communication device can include an antenna and any of the acoustic wave filters disclosed herein in communication with the antenna.

In another aspect, a method of manufacturing an acoustic wave resonator is disclosed. The method includes: forming an opening through at least a piezoelectric layer of an acoustic wave resonator to expose a conductive layer, the piezoelectric layer and the conductive layer included in a multi-layer piezoelectric substrate of the acoustic wave resonator; filling the opening with conductive material to form a via though the piezoelectric layer; and electrically connecting the conductive layer to a grounding structure by way of the via, the grounding structure being positioned over the piezoelectric layer and an interdigital transducer electrode of the acoustic wave resonator, and the interdigital transducer electrode being positioned over the piezoelectric layer.

The method can further include forming a dispersion adjustment layer over the interdigital transducer electrode. Alternatively or additionally, the method can include forming a dispersion adjustment layer between the piezoelectric layer and the conductive layer. A dispersion adjustment layer can include silicon dioxide. The acoustic wave resonator can be a surface acoustic wave resonator configured to generate a surface acoustic wave.

In another aspect, an acoustic wave resonator includes a piezoelectric layer over a substrate, an interdigital transducer electrode over the piezoelectric layer, a grounding structure over the interdigital transducer electrode, and a conductive layer positioned between the piezoelectric layer and the substrate. The piezoelectric layer has etched portions on opposing sides of the acoustic wave resonator. The conductive layer is electrically connected to the grounding structure by way of conductive material in the etched portions of the piezoelectric layer.

The acoustic wave resonator can be a surface acoustic wave resonator configured to generate a surface acoustic wave. The acoustic wave resonator can further include a dispersion adjustment layer disposed over the interdigital transducer electrode. Alternatively or additionally, the acoustic wave resonator can further include a dispersion adjustment layer disposed between the piezoelectric layer and the conductive layer.

In another aspect, a method of manufacturing an acoustic wave resonator is disclosed. The method includes: etching portions of a piezoelectric layer of an acoustic wave resonator, the piezoelectric layer being over a conductive layer, and the piezoelectric layer and the conductive layer being included in a multi-layer piezoelectric substrate of the acoustic wave resonator; filling the etched portions with conductive material; and electrically connecting the conductive material to a grounding structure, the grounding structure being positioned over the piezoelectric layer and an interdigital transducer electrode of the acoustic wave resonator, and the interdigital transducer electrode being positioned over the piezoelectric layer.

Etching portions of the piezoelectric layer can include etching back portions of the piezoelectric layer. The acoustic wave resonator can be a surface acoustic wave resonator configured to generate a surface acoustic wave.

The method can further include etching corresponding portions of a dispersion adjustment layer disposed between the piezoelectric layer and the conductive layer and filling the corresponding etched portions of the dispersion adjustment layer with the conductive material.

The method can further include etching corresponding portions of a second dispersion adjustment layer over the interdigital transducer electrode and filling the corresponding etched portions of the second dispersion adjustment layer with the conductive material.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/723,714 (U.S. Publication 2020/0212875), titled "MULTI-LAYER PIEZOELECTRIC SUBSTRATE WITH GROUNDING STRUCTURE," filed Dec. 20, 2019, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
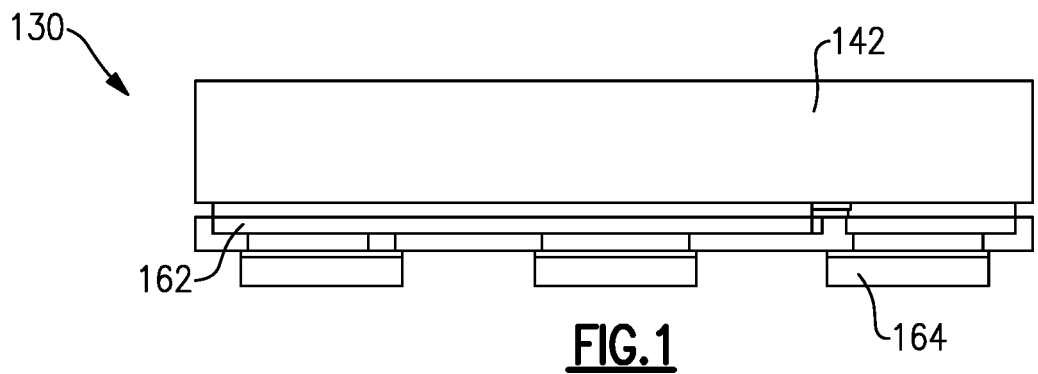
FIG. 1 is a cross sectional view of a portion of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With the explosive growth of mobile communication, the frequency spectrum is becoming crowded. This can generate demanding specifications for radio frequency (RF) filters and duplexers with steep roll-off, low temperature drift, low insertion loss, miniature size, the like, or any combination thereof. Bulk acoustic wave (BAW) filters can include a film bulk acoustic resonator (FBAR) filters and/or a solidly mounted resonator (SMR). Such BAW filters can fulfill the demanding specifications for RF filters in certain applications. Surface acoustic wave (SAW) filters typically have higher frequency drift over temperature. Such SAW filters may encounter difficulty in meeting stringent filter specifications. However, BAW filters are generally more expensive and larger in size than SAW filters.

Aspects of this disclosure are related to a surface acoustic wave device with a multi-layer piezoelectric substrate that includes a lithium-based piezoelectric layer, such as a lithium tantalate layer (LT) or a lithium niobate (LN) layer, over a substrate layer and a conductive layer disposed between the piezoelectric layer and the substrate layer. The conductive layer can be in electrical communication with a grounding structure positioned over the piezoelectric layer. In some other applications, the conductive layer can be in electrical communication with a grounding structure positioned under the substrate layer.

Surface acoustic wave filters and/or duplexers including the surface acoustic wave device with a grounded conductive layer improve receive and/or transmit isolation. For example, isolation degradation can be caused by parasitic capacitance between any of the input port, the output port, and other signal pads on the piezoelectric layer. The parasitic capacitance can cause electrical coupling between the signals on the input port, the output port, and the other signal pads. A multi-layer piezoelectric substrate having a grounded conductive layer can attenuate this electrical coupling.

Acoustic wave filters can filter radio frequency (RF) signals in a variety of applications, such as in an RF front end of a mobile phone. An acoustic wave filter can be implemented with surface acoustic wave (SAW) devices. SAW devices include SAW resonators, SAW delay lines, and multi-mode SAW (MMS) filters (e.g., double mode SAW (DMS) filters). Although some embodiments may be described with reference to SAW resonators for illustrative purposes, any suitable principles and advantages disclosed herein can be applied to any other suitable type of SAW device.

FIG. 1 is a cross sectional view of a portion of a surface acoustic wave resonator 130. As illustrated, the surface acoustic wave resonator 130 includes a piezoelectric layer 142, a grounding structure 162 over the piezoelectric layer 142, and one or more pads 164 over the grounding structure 162. The piezoelectric layer 142 can be any suitable piezoelectric layer, such as a lithium niobate (LN) layer or lithium tantalate (LT) layer. The grounding structure 162 is electrically connected to ground. The grounding structure 162 can be any conductive structure arranged to provide a ground connection. The grounding structure 162 can include a conductive plate and/or one or more conductive pillars. The grounding structure 162 can include one or more ground pads of an acoustic wave component. The grounding structure 162 can include any suitable conductive material, such as copper (Cu), gold (Au), lead (Pb), aluminum (Al), silver (Ag), a conductive paste of one or more of Cu, Au, Pb, Al and Ag conductive particles with an adhesive, and the like. The one or more pads 164 can include any suitable pad material. The illustrated pads 164 can be used, for example, to connect the surface acoustic wave resonator 130 to a module or a circuit board.

Figure 2:
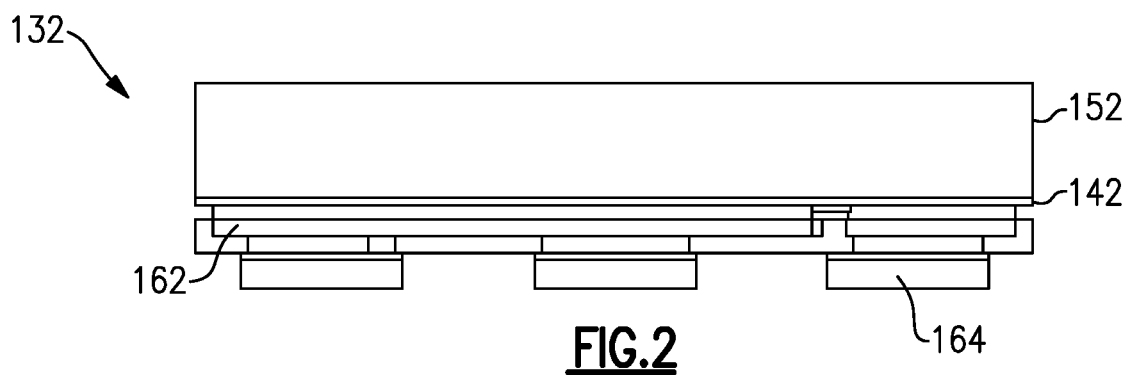
FIG. 2 is a cross sectional view of a portion of another surface acoustic wave resonator.

FIG. 2 is a cross sectional view of a portion of a surface acoustic wave resonator 132 having a multi-layer piezoelectric substrate. The surface acoustic wave resonator 132 is like the surface acoustic wave resonator 130 of FIG. 1 except that the piezoelectric layer 142 of the surface acoustic wave resonator 132 is over a carrier substrate 152 in the surface acoustic wave resonator 132. The surface acoustic wave resonator 132 can be referred to as a multi-layer piezoelectric substrate surface acoustic wave resonator. The carrier substrate 152 can be a silicon substrate, a quartz substrate, a sapphire substrate, a ceramic substrate, a polycrystalline spinel substrate, or any other suitable carrier substrate. The carrier substrate 152 can be referred to as a support substrate, carrier wafer, or a support wafer.

Figure 3:
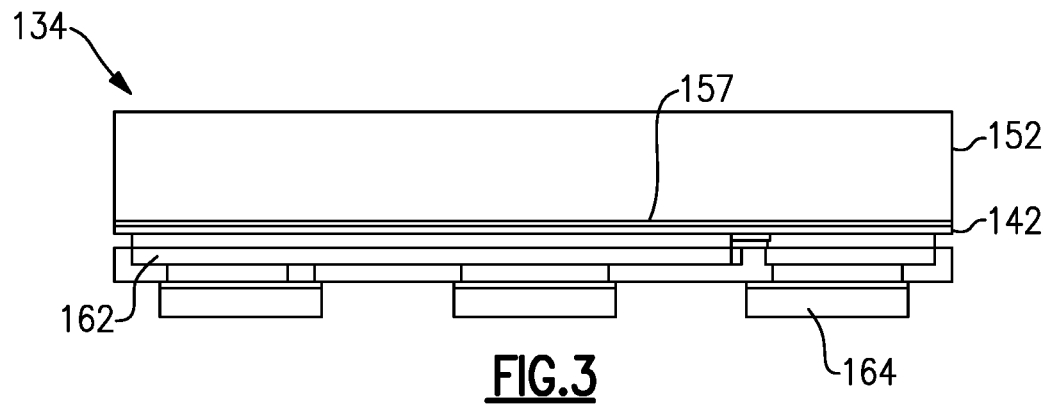
FIG. 3 is a cross sectional view of a portion of another surface acoustic wave resonator.

FIG. 3 is a cross sectional view of a portion of a surface acoustic wave resonator 134 having a multi-layer piezoelectric substrate. The surface acoustic wave resonator 134 is like the surface acoustic wave resonator 132 of FIG. 2 except that a conductive layer 157 is included in the surface acoustic wave device 134. The illustrated conductive layer 157 is positioned between the carrier substrate 152 and the piezoelectric layer 142. The conductive layer 157 in FIG. 3 is floating. The conductive layer 157 in FIG. 3 is not electrically connected to the grounding structure 162. The conductive layer 157 can be an aluminum layer, a titanium layer, and iron layer, a copper layer, another standard material used for conductive traces, or any other suitable conductive layer.

Figure 4A:
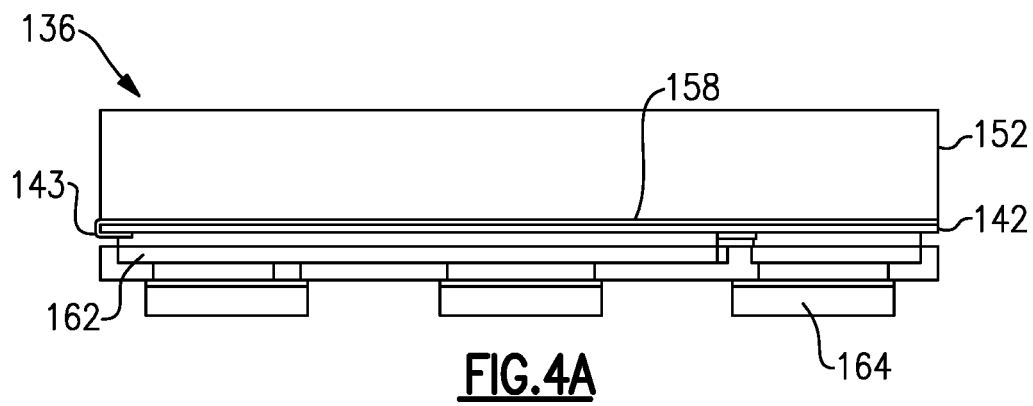
FIG. 4A is a cross sectional view of a portion of another surface acoustic wave resonator with a multi-layer piezoelectric substrate according to an embodiment.

FIG. 4A is a cross sectional view of a portion of a surface acoustic wave resonator 136 with a multi-layer piezoelectric substrate according to an embodiment. The surface acoustic wave resonator 136 can be referred to as a multi-layer piezoelectric substrate surface acoustic wave resonator. The surface acoustic wave resonator 136 is like the surface acoustic wave resonator 132 of FIG. 2 except that a conductive layer 158 is electrically connected to the grounding structure 162. Accordingly, the conductive layer 158 is configured to be grounded. The illustrated conductive layer 158 is positioned between the carrier substrate 152 and the piezoelectric layer 142. As illustrated, the conductive layer 158 is electrically connected to ground by a wrapping portion 143 of conductive material around the piezoelectric layer 142 such that the conductive layer 158 electrically connects with the grounding structure 162. Accordingly, unlike the floating conductive layer 157 of FIG. 3, the conductive layer 158 can be grounded as illustrated. The wrapping portion 143 includes conductive material extending along at least a portion of a sidewall of the piezoelectric layer 142 that is included in an electrical path between the conductive layer 158 and the grounding structure 162. The conductive layer 158 can be an aluminum layer, or any other suitable conductive layer. The conductive layer 158 can have a thickness of approximately 1 micron, of between approximately 0.5 micron and approximately 2 microns, of between approximately 10 nanometers and approximately 10 microns, or greater than 10 microns.

One wrapping portion 143 is illustrated on the left side of the surface acoustic wave resonator 136 in FIG. 4A. However, in some other embodiments, the surface acoustic wave resonator 136 can include two or more wrapping portions. For example, the surface acoustic wave resonator 136 can include the wrapping portions 143 on the left side and the right side of the surface acoustic wave resonator 136 in FIG. 4A. In such embodiments, there can be additional ground connections for a stronger ground connection.

Figure 4B:
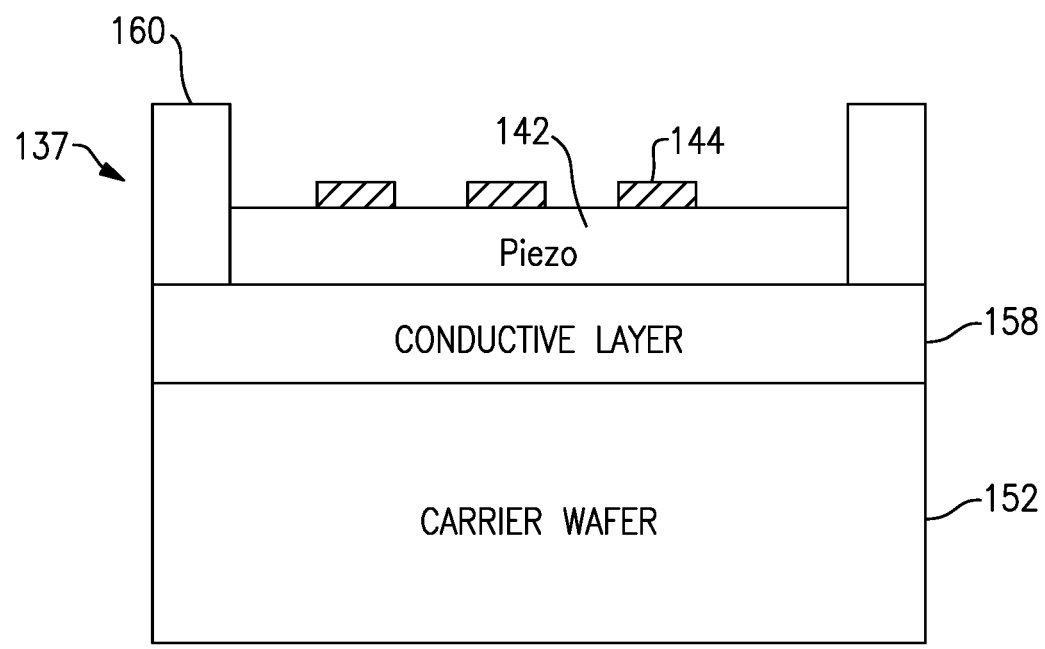
FIG. 4B is a cross sectional view of a portion of another surface acoustic wave resonator with a multi-layer piezoelectric substrate according to another embodiment.

FIG. 4B is a cross sectional view of a portion of a surface acoustic wave resonator 137 with a multi-layer piezoelectric substrate according to another embodiment. The multi-layer piezoelectric substrate of the surface acoustic wave resonator 137 can include a conductive layer 158 implemented in accordance with any suitable principles and advantages disclosed herein. As illustrated, the surface acoustic wave resonator 137 includes the piezoelectric layer 142 over the carrier substrate 152. The conductive layer 158 is positioned between the carrier substrate 152 and the piezoelectric layer 142. An interdigital transducer (IDT) electrode 144 is positioned over the piezoelectric layer 142. The IDT electrode 144 can be in physical contact with the piezoelectric layer 142 as illustrated. The IDT electrode 144 can include aluminum (Al) or any suitable alloy thereof. The IDT electrode 144 can include two or more conductive layers in some instances. Such an IDT electrode 144 can include aluminum (Al) and another conductive layer such as molybdenum (Mo), tungsten (W), gold (Au), silver (Ag), copper (Cu), platinum (Pt), ruthenium (Ru), titanium (Ti), or the like. In some embodiments, the IDT electrode 144 can be a multi-layer IDT electrode.

The surface acoustic wave resonator 137 of FIG. 4B illustrates one approach to providing electrical communication between the conductive layer 158 and the grounding structure 162 of the acoustic wave resonator 136 of FIG. 4A. In the surface acoustic wave resonator 137, one or more portions of the piezoelectric layer 142 can be removed to expose the conductive layer 158 during manufacture. The removed portions can be filled with conductive material 160 such that the conductive material 160 is in contact with the conductive layer 158 and the grounding structure 162 (not illustrated) that can be positioned over the piezoelectric layer 142. The conductive material 160 is included in an electrical path between the conductive layer 158 and the grounding structure 162. Thus, the conductive layer 158 is electrically connected to the grounding structure 162 by way of the conductive material 160.

One or more etched portions of the piezoelectric layer 142 can be etched away and/or etched back from one or more edges of the surface acoustic wave resonator 137 using any suitable etching process, such as wet etching, dry etching, chemical-mechanical planarization (CMP), laser drilling, or the like. The conductive material 160 can be deposited in the etched portion using any suitable deposition process, such as physical vapor deposition (PVD), chemical vapor deposition (CVD), electrochemical deposition (ECD), molecular beam epitaxy (MBE), atomic layer deposition (ALD), electron beam deposition, and the like. The conductive material 160 can be any suitable conductive material, such as molybdenum (Mo), tungsten (W), gold (Au), silver (Ag), copper (Cu), platinum (Pt), ruthenium (Ru), titanium (Ti), or the like.

Figure 4C:
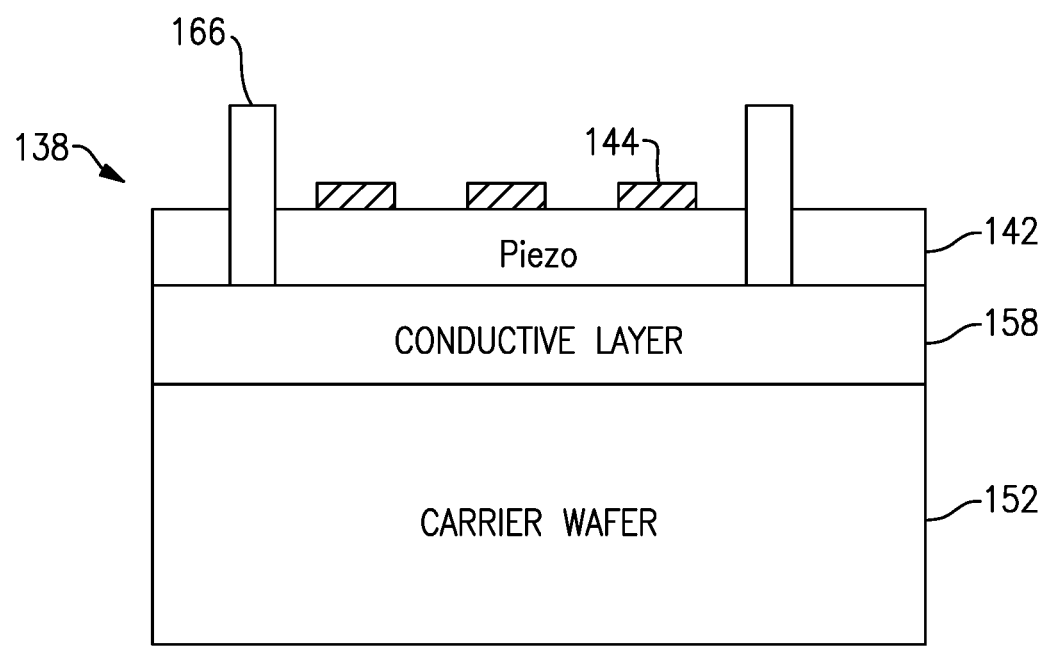
FIG. 4C is a cross sectional view of a portion of another surface acoustic wave resonator with a multi-layer piezoelectric substrate according to another embodiment.

FIG. 4C is a cross sectional view of a portion of a surface acoustic wave resonator 138 with a multi-layer piezoelectric substrate according to another embodiment. The multi-layer piezoelectric substrate of the surface acoustic wave resonator 138 can include a conductive layer 158 implemented in accordance with any suitable principles and advantages disclosed herein. The surface acoustic wave resonator 138 is like the surface acoustic wave resonator 137 of FIG. 4B except that FIG. 4C illustrates another approach to providing electrical communication between the conductive layer 158 and the grounding structure 162 of FIG. 4A.

In the surface acoustic wave resonator 138, one or more vias 166 filled with conductive material provide electrical communication between the conductive layer 158 and the grounding structure 162 (not illustrated) that can be positioned over the piezoelectric layer 142. The vias 166 are included in electrical path between the conductive layer 158 and the grounding structure 162. Although the vias 166 are illustrated as filled vias, the vias 166 can be a conformal via (see FIG. 4F). Any other suitable conductive structure can alternatively or additionally be implemented in the electrical path between the conductive layer 158 and the grounding structure 162. The vias 166 can include a through-hole via.

The vias 166 can be formed using any suitable via formation processes. For example, an opening can be formed through at least the piezoelectric layer 142 to expose the conductive layer 158 during manufacture. The opening can extend to the upper surface of the conductive layer 158, below the surface of the conductive layer 158, or the like. In an aspect, the opening can be formed using any suitable etching process. The opening can be filled with the conductive material to form the via 166 through the piezoelectric layer 142 such that the conductive material of the via 166 is in contact with the conductive layer 158. In an aspect, the opening can be filled with the conductive material using any suitable deposition process. In an aspect, sidewalls of the opening can be lined with an electrically insulating material before filling the opening with the conductive material to form the via 166 through the piezoelectric layer 142. The conductive material of the via 166 can also be in contact with the grounding structure 162 that can be positioned over the piezoelectric layer 142 to provide electrical communication between the grounding structure 162 and the conductive layer 158 through the one or more vias 166.

The conductive material 160 can be any suitable conductive material, such as molybdenum (Mo), tungsten (W), gold (Au), silver (Ag), copper (Cu), platinum (Pt), ruthenium (Ru), titanium (Ti), aluminum (Al), or the like. Examples of insulating materials are silicon dioxide ($SiO_2$), silicon oxynitride compounds (SiON), silicon nitride compounds (SiN), tantalum oxide ($Ta_2O_5$), aluminum oxide ($Al_2O_3$), silicon carbide (SiC), tetraethyl orthosilicate (TEOS), silicon on glass (SOG), polyimide, and the like.

Figure 4D:
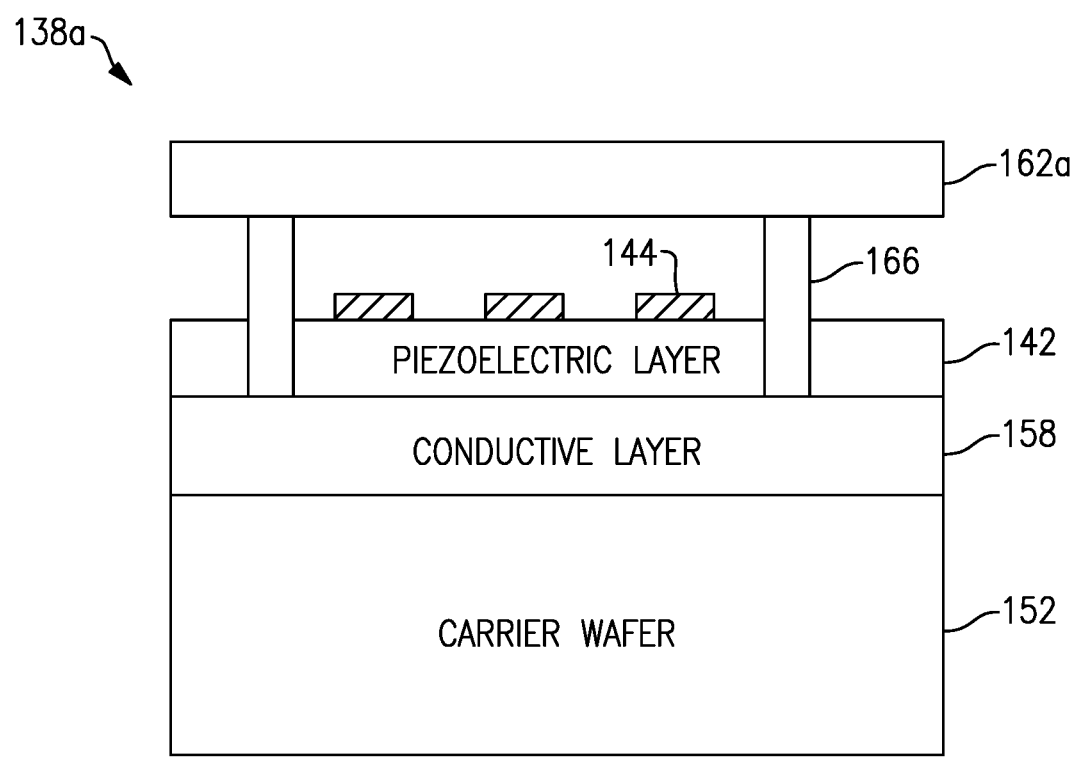
FIG. 4D is a cross sectional view of another surface acoustic wave resonator with a multi-layer piezoelectric substrate according to another embodiment.

FIG. 4D is a cross sectional view of a surface acoustic wave resonator 138a with a multi-layer piezoelectric substrate according to another embodiment. The acoustic wave resonator 138a is generally similar to the acoustic wave resonator 138 illustrated in FIG. 4C, except that the illustrated acoustic wave resonator 138a includes a grounding structure 162a. The grounding structure 162a is provided over the piezoelectric layer and in electrical communication with the conductive layer 158 through a via 166. Portions of the grounding structure 162a are positioned above the IDT electrode 144. The grounding structure 162a can be a conductive sheet configured at a ground potential. As one example, the grounding structure 162a can be a copper sheet configured at a ground potential.

Figure 4E:
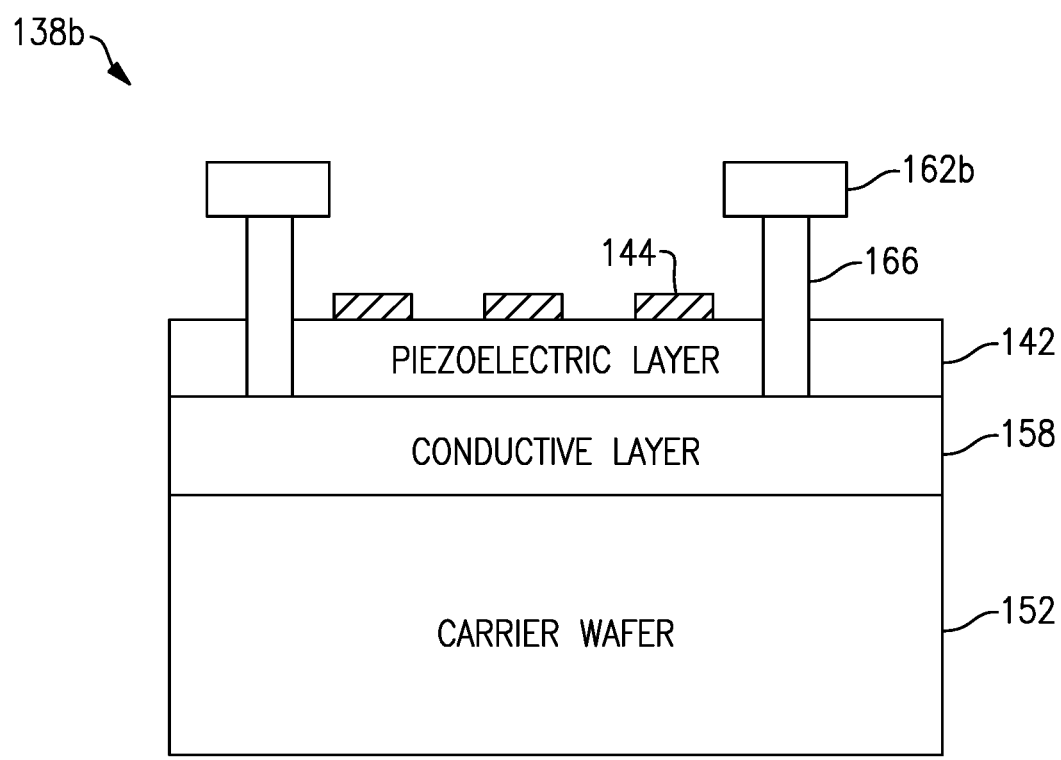
FIG. 4E is a cross sectional view of another surface acoustic wave resonator with a multi-layer piezoelectric substrate according to another embodiment.

FIG. 4E is a cross sectional view of a surface acoustic wave resonator 138b with a multi-layer piezoelectric substrate according to another embodiment. The acoustic wave resonator 138b is generally similar to the acoustic wave resonator 138a illustrated in FIG. 4D, except that a grounding structure 162b in the acoustic wave resonator 138b includes grounding structure portions that are spaced apart from each other. The grounding structure 162b is provided over the piezoelectric layer and in electrical communication with the conductive layer 158 through a via 166. The grounding structure 162b is positioned farther from the piezoelectric layer 142 than the IDT electrode 144. The grounding structure portions of the grounding structure 162b may be positioned laterally from the IDT electrode 144. The grounding structure 162b can include conductive pillars and/or conductive pads. The grounding structure 162b can include copper in certain applications.

Figure 4F:
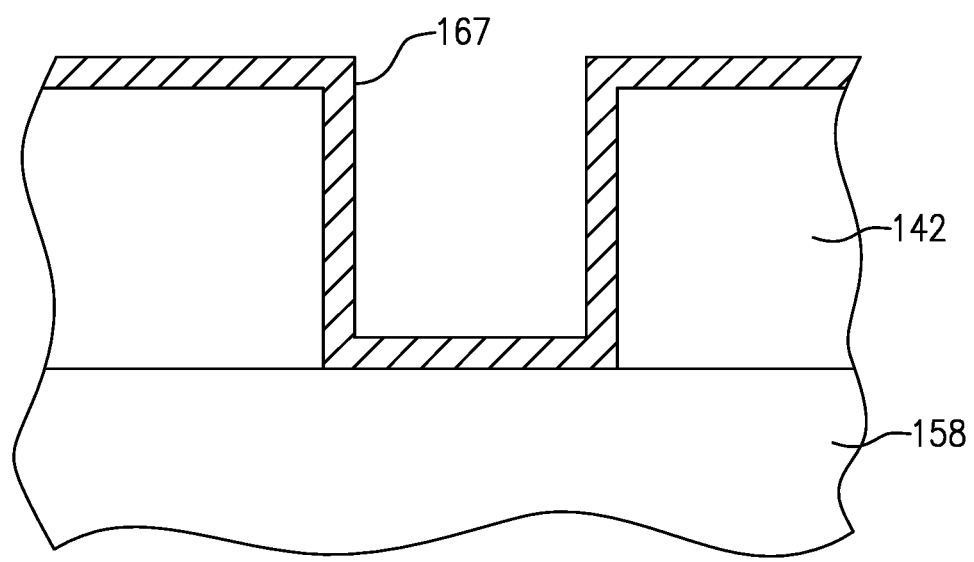
FIG. 4F is a cross sectional view of a portion of a surface acoustic wave resonator with a multi-layer piezoelectric substrate including a conformal via according to another embodiment.

FIG. 4F is a cross sectional view of a portion of a surface acoustic wave resonator with a multi-layer piezoelectric substrate including a conformal via 167 according to another embodiment. The portion of the surface acoustic wave resonator can include a conductive layer 158 and a piezoelectric layer 142 over the conductive layer 158. The conformal via 167 can include a conductive material that is conformally disposed at least along sidewalls of a via hole defined by portions of the piezoelectric layer 142. The conductive material can be also disposed at the bottom of the via hole defined by a portion of the conductive layer 158. The conductive material can be also disposed on at least a portion of the piezoelectric layer 142. Accordingly, the conductive material can provide an electrical connection to another element on the piezoelectric layer 142, such as an IDT electrode, that is positioned laterally from the conformal via 167. The conformal via 167 can be utilized in accordance with any suitable principles and advantages of any of the embodiments disclosed herein. In some embodiments, the conformal via 167 can be used in place of, for example, the conductive material 160 or the via 166 illustrated in any of FIGS. 4B-4E. According to some other embodiments, a combination of the conformal via 167 and another type of via can be implemented in an acoustic wave device. For example, a conductive pillar can be provided and/or connected to the portion of the conductive material of the conformal via that is disposed on the portion of the piezoelectric layer 142.

Figure 4G:
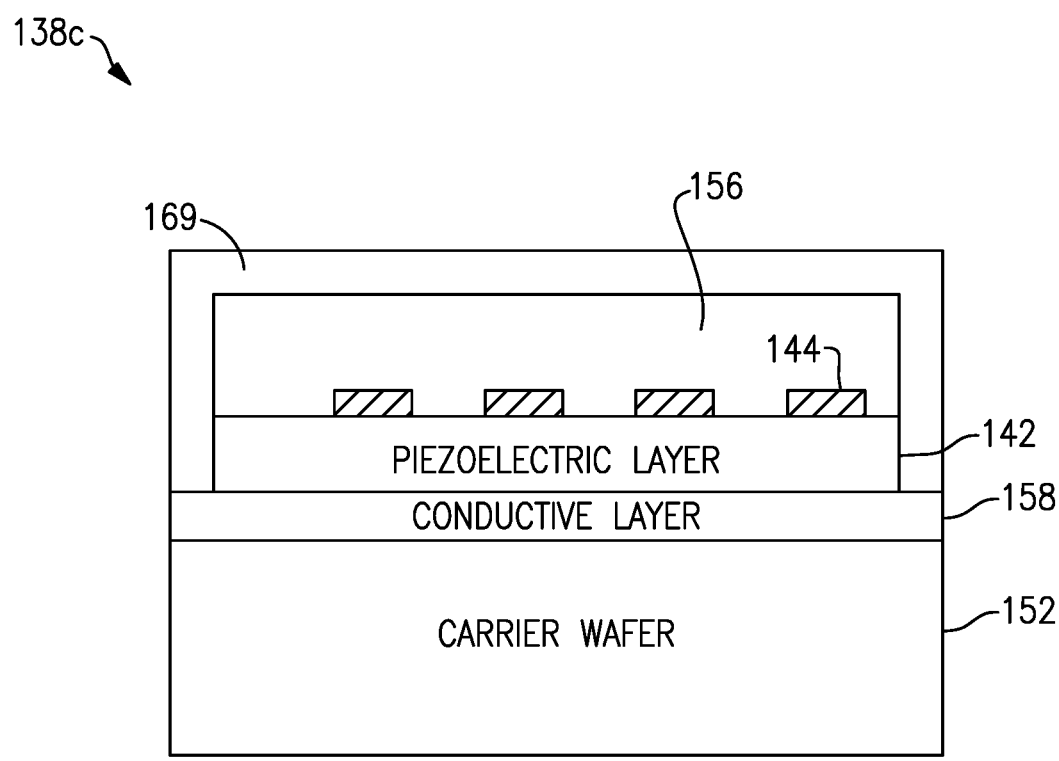
FIG. 4G is a cross sectional view of another surface acoustic wave resonator with a multi-layer piezoelectric substrate according to another embodiment.

FIG. 4G is a cross sectional view of a surface acoustic wave resonator 138c with a multi-layer piezoelectric substrate according to another embodiment. As in FIGS. 4B-4E, the surface acoustic wave resonator 138c includes a carrier substrate 152, a piezoelectric layer 142 over the carrier substrate 152, and a conductive layer 158 between the carrier substrate 152 and the piezoelectric layer 142. The surface acoustic wave resonator 138c also includes a temperature compensation layer 156 and a conductive material 169 that is conformally disposed at least along sidewalls of the piezoelectric layer 142 and over the temperature compensation layer 156. In some other instances, one or more of a passivation layer, a dispersion adjustment layer, an air cavity, or the like can be disposed between the temperature compensation layer 156 and the conductive material 169.

The temperature compensation layer 156 can be a silicon dioxide ($SiO_2$) layer, or any other suitable temperature compensation layer. The temperature compensation layer 156 can be a layer of any other suitable material having a positive temperature coefficient of frequency. For instance, the temperature compensation layer 156 can be a tellurium dioxide ($TeO_2$) layer or a silicon oxyfluoride (SiOF) layer in certain applications. The temperature compensation layer 156 can include any suitable combination of $SiO_2$, $TeO_2$, and/or SiOF. The temperature compensation layer 156 can be a passivation layer, in some applications. The conductive material 169 can include any suitable conductive material. The conductive material 169 can include, for example, molybdenum (Mo), tungsten (W), gold (Au), silver (Ag), copper (Cu), platinum (Pt), ruthenium (Ru), titanium (Ti), aluminum (Al), or the like.

The conductive material 169 can serve as a grounding structure. In some applications, the surface acoustic wave resonator 138c can include another grounding structure (not illustrated) over the conductive material 169. The conductive material 169 can be included in an electrical path between the conductive layer 158 and the other grounding structure. Therefore, the conductive layer 158 can be electrically connected to a grounding structure by way of the conductive material 169 along sidewalls of the piezoelectric layer 142.

Figure 4H:
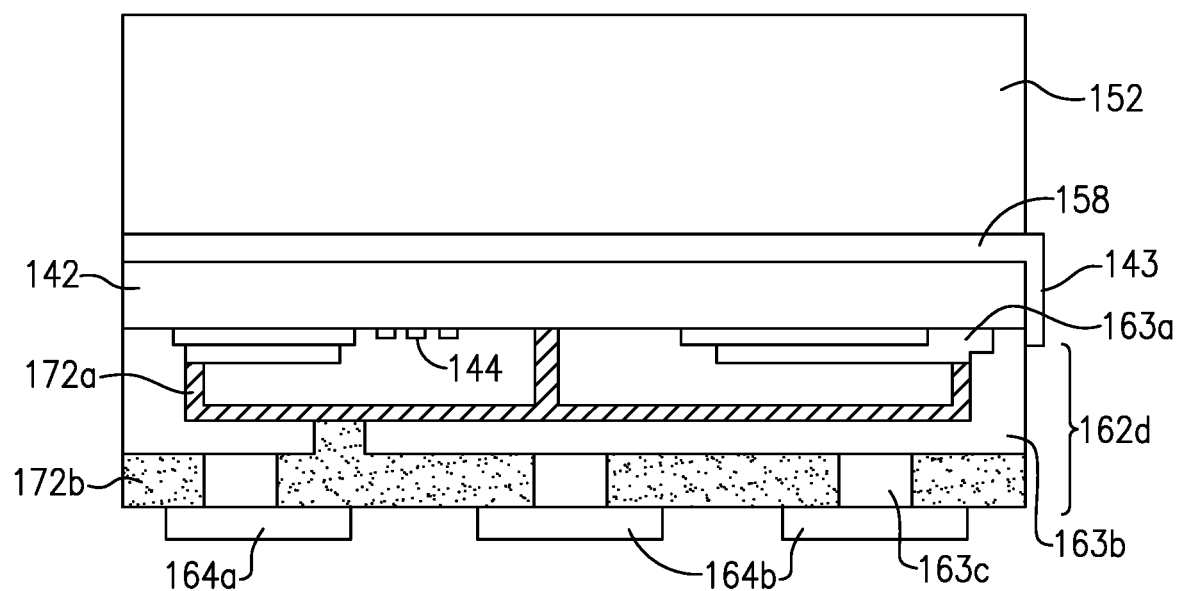
FIG. 4H is a cross sectional view of a surface acoustic wave resonator with a multi-layer piezoelectric substrate according to another embodiment.

FIG. 4H illustrates a cross sectional view of a surface acoustic wave resonator 138d with a multi-layer piezoelectric substrate according to another embodiment. The surface acoustic wave resonator 138d can be referred to as a multi-layer piezoelectric substrate surface acoustic wave resonator. As illustrated, the surface acoustic wave resonator 138d includes a carrier substrate 152, a piezoelectric layer 142, a grounding structure 162d over the piezoelectric layer 142, an interdigital transducer electrode 144 on the piezoelectric layer 142, a conductive layer 158 between the carrier substrate 152 and the piezoelectric layer 142, and one or more pads over the grounding structure 162d. As illustrated, the conductive layer 158 is electrically connected to ground by wrapping a portion 143 of conductive material around the piezoelectric layer 142 such that the conductive layer 158 electrically connected with the grounding structure 162d.

The one or more pads can include a signal pad 164a for a signal connection and ground pads 164b for a ground connection. The ground pads 164b are connected to the grounding structure 162d. The grounding structure 162d can include conductive portions 163a, 163b, 163c. The conductive portions 163a, 163b, 163c of the grounding structure 162d can include any suitable conductive material, such as copper (Cu), gold (Au), lead (Pb), aluminum (Al), silver (Ag), a conductive paste of one or more of Cu, Au, Pb, Al, and Ag conductive particles with an adhesive, or the like. The conductive portion 163a can be thicker than the IDT electrode 144. The surface acoustic wave resonator 138d also includes dielectric portions 172a, 172b that can provide physical support for the grounding structure 162d.

Figure 4I:
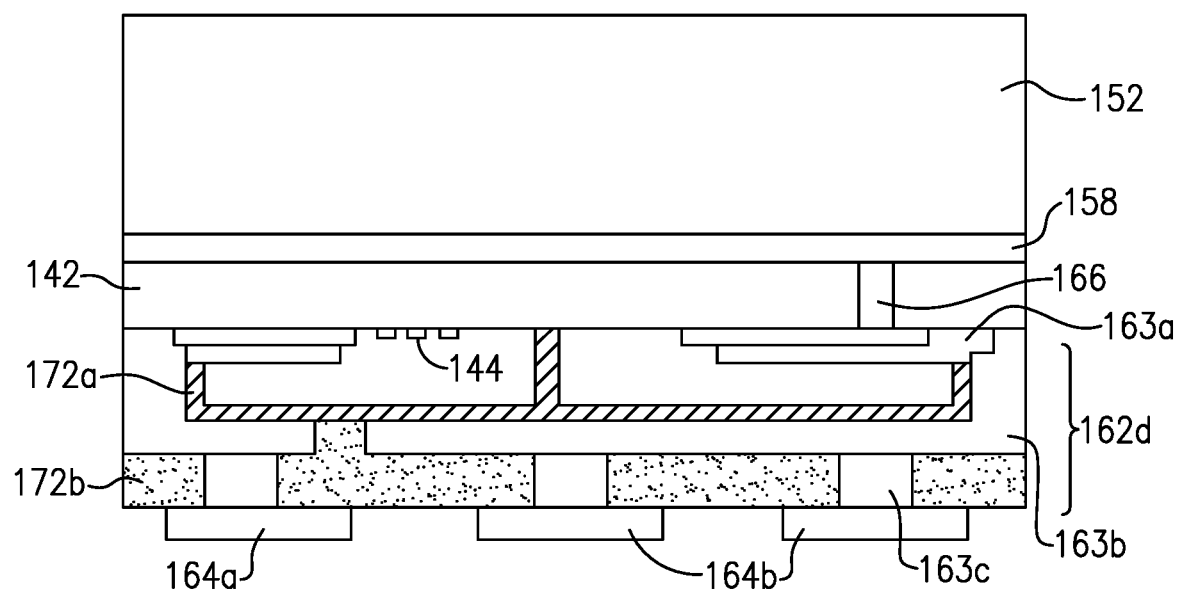
FIG. 4I is a cross sectional view of a surface acoustic wave resonator with a multi-layer piezoelectric substrate according to another embodiment.

FIG. 4I illustrates a cross sectional view of a surface acoustic wave resonator 138e with a multi-layer piezoelectric substrate according to another embodiment. The surface acoustic wave resonator 138e is like the surface acoustic wave resonator 138d illustrated in FIG. 4H except the conductive layer 158 in FIG. 4I is connected to the grounding structure 162d by way of a via 166.

Figure 5:
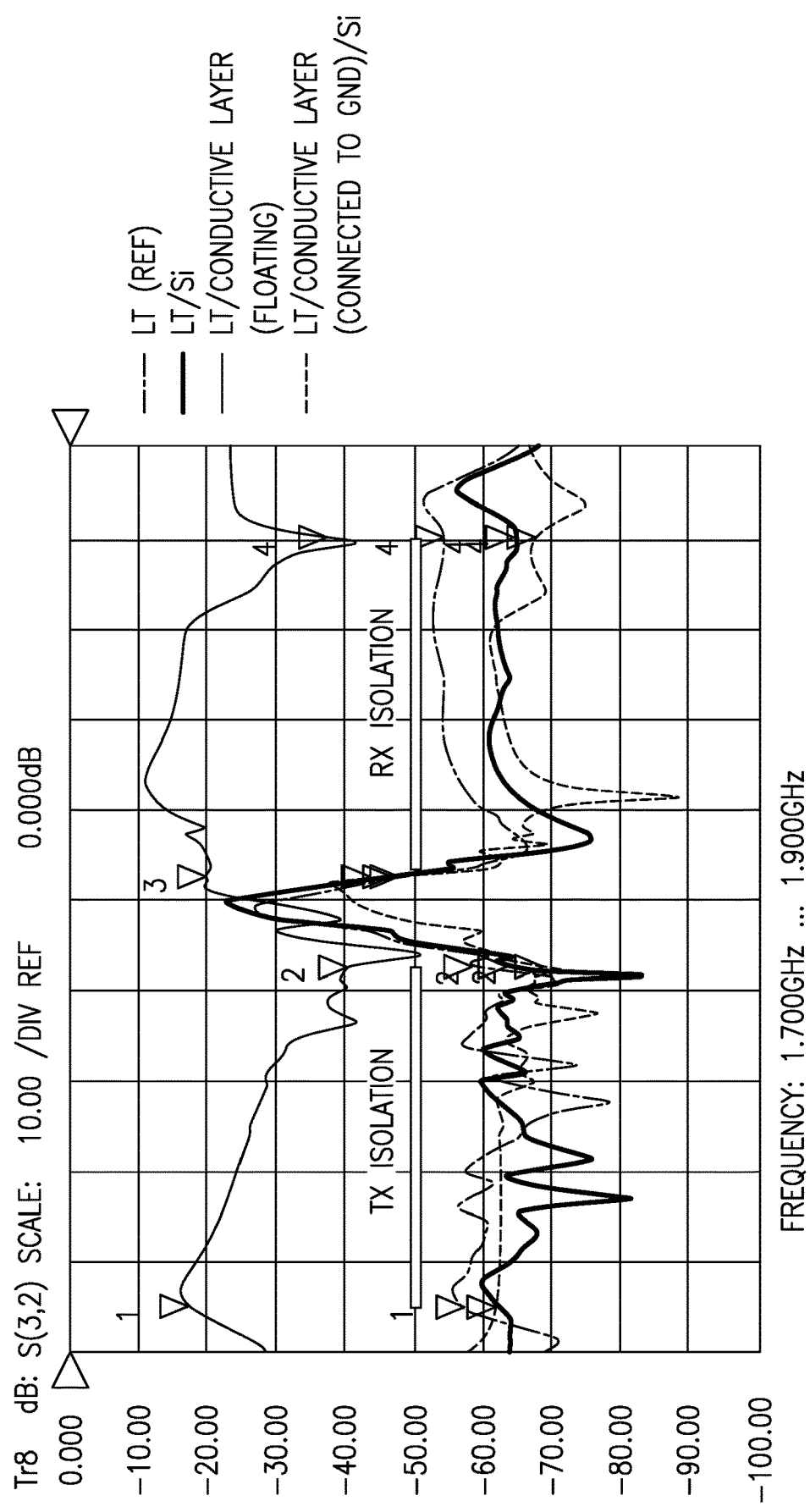
FIG. 5 is a graph comparing receive and transmit isolation curves of acoustic wave resonators without conduction layers to an acoustic wave resonator with a conduction layer according to an embodiment.

FIG. 5 is a graph of transmit and receive isolation curves of acoustic wave resonators without a conduction layer as illustrated in FIGS. 1-2, and an acoustic wave resonator with a floating conductive layer as illustrated in FIG. 3, relative to an acoustic wave resonator with a conduction layer that is grounded as illustrated in FIG. 4A. The representative LT (REF) transmit and receive isolation curves can be associated with the surface acoustic wave resonator 130 of FIG. 1. The representative LT/Si transmit and receive isolation curves can be associated with the surface acoustic wave resonator 132 of FIG. 2; and the representative LT/Conductive Layer (floating) transmit and receive isolation curves can be associated with the surface acoustic wave resonator 134 of FIG. 3. The representative LT/Conductive Layer (connected to GND)/Si transmit and receive isolation curves can be associated with the surface acoustic wave resonators 136 of FIG. 4A.

The graph illustrates that a floating conductive layer positioned between the carrier substrate 152 and the piezoelectric layer 142 can degrade isolation. FIG. 5 also indicates that a conductive layer between the carrier substrate 152 and the piezoelectric layer 142 can improve isolation. FIG. 5 illustrates that an acoustic wave resonator with a multi-layer piezoelectric substrate having a conductive layer positioned between the piezoelectric layer and the carrier substrate can suppress electronic coupling within the multi-layer substrate. The suppressed electronic coupling can improve transmit and receive isolation.

Figure 6:
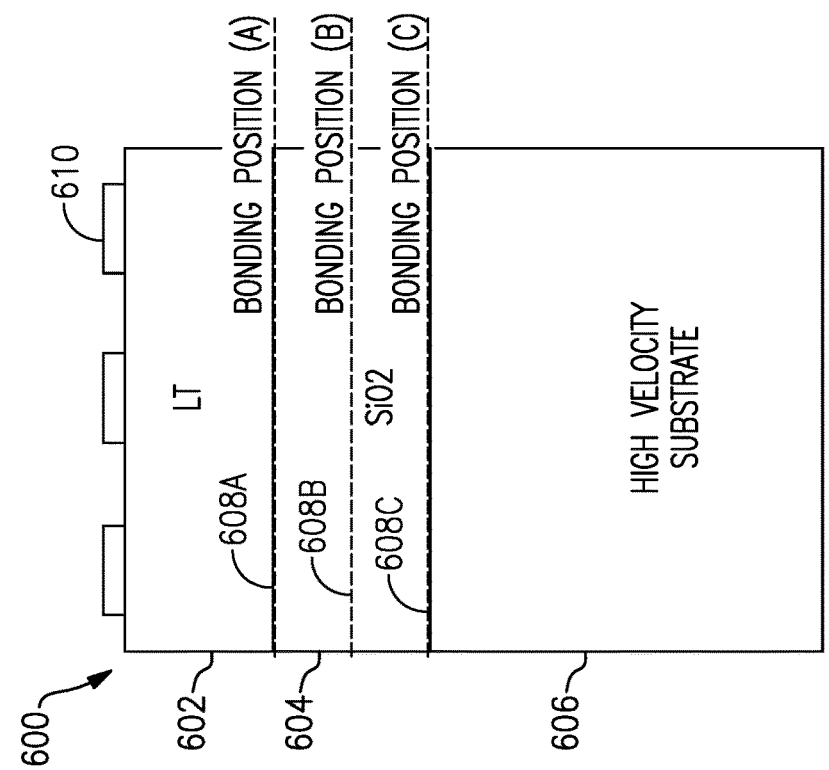
FIG. 6 is a cross sectional view of a portion of a surface acoustic wave resonator with a multi-layer piezoelectric substrate illustrating conductive layer bonding positions according to an embodiment.

FIG. 6 is a cross sectional view of a portion of a surface acoustic wave resonator 600 with a multi-layer piezoelectric substrate illustrating conductive layer bonding positions according to an embodiment. As illustrated, the acoustic wave resonator 600 includes a carrier substrate 606, a piezoelectric layer 602 over the carrier substrate 606, a silicon dioxide (SiO2) layer 604 and a conductive layer 608 positioned between the piezoelectric layer 602 and the carrier substrate 606, and an IDT electrode 610 over the piezoelectric layer 602. The conductive layer 608 is configured to connect to a grounding structure for a ground connection. The carrier substrate 606 can be a high velocity carrier substrate, a silicon substrate, a quartz substrate, a sapphire substrate, a ceramic, a polycrystalline spinel substrate, or any other suitable carrier substrate. The silicon dioxide layer 604 can be a dispersion adjustment layer. The piezoelectric layer 602 can be can be any suitable piezoelectric layer, such as a lithium niobate layer or lithium tantalate layer. The IDT electrode 610 can be in physical contact with the piezoelectric layer 602 as illustrated. The IDT electrode 610 can include aluminum (Al), any suitable alloy of aluminum, molybdenum (Mo), tungsten (W), gold (Au), silver (Ag), copper (Cu), platinum (Pt), ruthenium (Ru), titanium (Ti), or the like.

FIG. 6 illustrates three example bonding locations for the conductive layer 608. In other aspects, other bonding positions can be used. In a first illustrated location, conductive layer 608 is represented by conductive layer 608A and positioned between the piezoelectric layer 602 and the silicon dioxide layer 604. In an illustrated second location, conductive layer 608 is represented by conductive layer 608B and positioned within the silicon dioxide layer 604. In a third illustrated location, conductive layer 608 is represented by conductive layer 608C and positioned between the silicon dioxide layer 604 and the carrier substrate 606.

Figure 7:
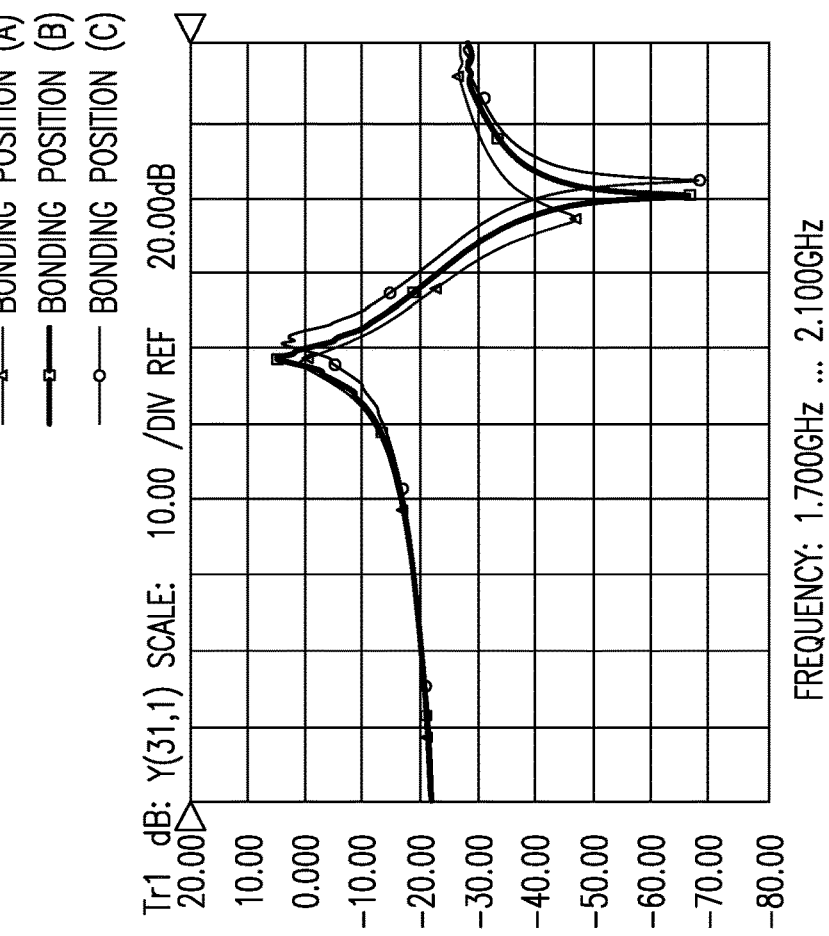
FIG. 7 is a graph comparing transmission characteristics of acoustic wave resonators having a conductive layer at different bonding positions according to an embodiment.

FIG. 7 is a graph comparing transmission characteristics of acoustic wave resonator 600 having the conductive layer 608 at the different bonding positions A, B, and C illustrated in FIG. 6. FIG. 7 illustrates that transmission characteristics for an acoustic wave resonator having a multi-layer piezoelectric substrate that includes a conductive layer at bonding position A are degraded relative to an acoustic wave resonator having a multi-layer piezoelectric substrate that includes a conductive layer at bonding positions B or C. Specifically, for example, the anti-resonance of the acoustic wave resonator having the multi-layer piezoelectric substrate that includes the conductive layer at bonding position A is degraded relative to the acoustic wave resonator having the multi-layer piezoelectric substrate that includes the conductive layer at bonding positions B or C.

FIG. 7 further illustrates that an acoustic wave resonator having a multi-layer piezoelectric substrate that includes a silicon dioxide layer and conductive layer at bonding position C provide better transmission characteristics relative to an acoustic wave resonator having a multi-layer piezoelectric substrate that includes a silicon dioxide layer and a conductive layer at bonding positions A or B. For example, at bonding position A, the conductive layer 608A is in direct contact with the piezoelectric layer 602, which may degrade the electrical performance of the IDT electrode 610. Because the silicon dioxide layer's permittivity is smaller than the permittivity of the piezoelectric layer 602, insulation by the silicon dioxide layer 604 may help to improve the electrical characteristics of the IDT electrode 610. Therefore, in some embodiments, it can be preferable to position a conductive layer with an insulating layer (e.g., silicon dioxide layer 604) that has a sufficient thickness between the layer and the piezoelectric layer 602.

Conductive layers electrically connected to grounding structures can be implemented in a variety of different multi-layer piezoelectric substrate acoustic wave devices. Examples of such acoustic wave devices will be described with reference to FIGS. 8A to 8C. Any of these example acoustic wave devices can be implemented in any suitable electrical connections to a grounding structure positioned above a piezoelectric layer. Alternatively or additionally, any of these example acoustic wave devices can be implemented in any suitable electrical connections to a grounding structure positioned below a carrier substrate.

Figure 8A:
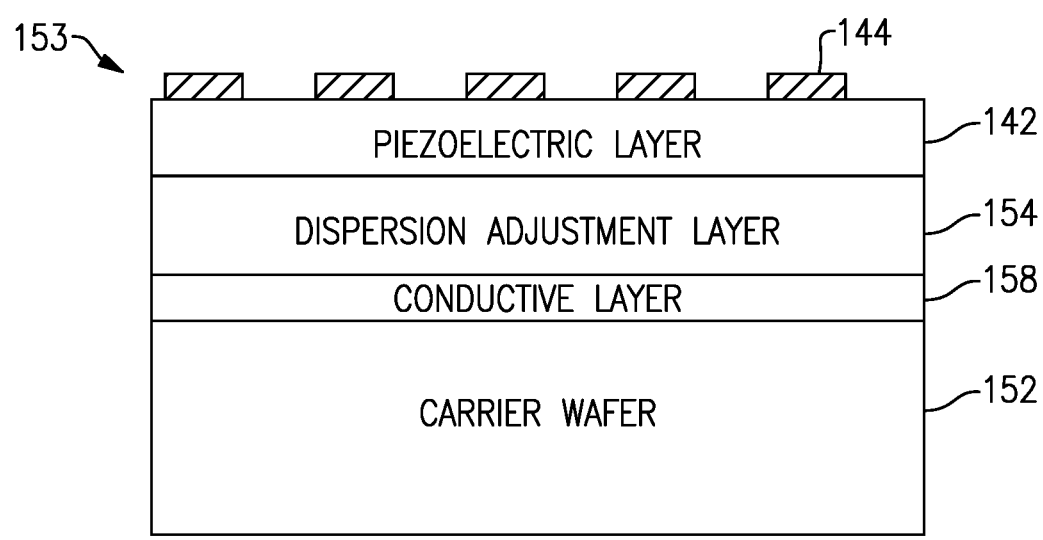
FIG. 8A is a cross sectional view of a portion of a surface acoustic wave resonator with a multi-layer piezoelectric substrate according to an embodiment.

FIG. 8A is a cross sectional view of a portion of a surface acoustic wave resonator 153 with a multi-layer piezoelectric substrate according to an embodiment. The surface acoustic wave resonator 153 can include a multi-layer piezoelectric substrate in accordance with any suitable principles and advantages disclosed herein. As illustrated, the surface acoustic wave resonator 153 includes a carrier substrate 152, a conductive layer 158 over the carrier substrate 152, a dispersion adjustment layer 154 over the conductive layer, a piezoelectric layer 142 over the dispersion adjustment layer 154, and an IDT electrode 144 on the piezoelectric layer 142.

The carrier substrate 152 can be a silicon substrate, a quartz substrate, a sapphire substrate, a ceramic substrate, a polycrystalline spinel substrate, or any other suitable carrier substrate. The illustrated conductive layer 158 is positioned between the dispersion adjustment layer 154 and the carrier substrate 152. The conductive layer 158 can include an aluminum (Al) layer, any suitable aluminum (Al) alloy layer, a molybdenum (Mo) layer, a tungsten (W) layer, a gold (Au) layer, a silver (Ag) layer, a copper (Cu) layer, a platinum (Pt) layer, a ruthenium (Ru) layer, a titanium (Ti) layer, or any other suitable conductive layer. The conductive layer 158 can include two or more conductive layers in some instances.

The illustrated dispersion adjustment layer 154 is positioned between the conductive layer 158 and the piezoelectric layer 142. The dispersion adjustment layer 154 can alternatively be or additionally include any suitable insulation layer, temperature compensation layer, dielectric layer and/or adhesion layer. The dispersion adjustment layer 154 can be a silicon nitride layer, a silicon dioxide layer, or any other suitable dispersion adjustment layer. The piezoelectric layer 142 can be any suitable piezoelectric layer, such as a lithium niobate (LN) layer or lithium tantalate (LT) layer. The IDT electrode 144 can be in physical contact with the piezoelectric layer 142 as illustrated. The IDT electrode 144 can include aluminum (Al) or any suitable alloy thereof. The IDT electrode 144 can include two or more conductive layers in some instances. Such an IDT electrode 144 can include aluminum (Al) and another conductive layer such as molybdenum (Mo), tungsten (W), gold (Au), silver (Ag), copper (Cu), platinum (Pt), ruthenium (Ru), titanium (Ti), or the like.

The conductive layer 158 can be in electrical communication with a grounding structure positioned over the piezoelectric layer 142 in the surface acoustic wave resonator 153. Alternatively or additionally, the conductive layer 158 can be in electrical communication with a grounding structure positioned under the carrier substrate 152. The conductive layer 158 can be referred to as a conductive layer 158. In one aspect, the dispersion adjustment layer 154 and the piezoelectric layer 142 can be etched away or etched back at one or more edges of the surface acoustic wave resonator 153 and the etched away or etched back portions can be filled with conductive material such that the conductive material is in electrical communication with the grounding structure and the conductive layer 158. In another aspect, at least one via can be formed through the piezoelectric layer 142 and the dispersion adjustment layer 154 of the surface acoustic wave resonator 153 such that conductive material filling the via provides electrical communication between the grounding structure and the conductive layer 158.

Figure 8B:
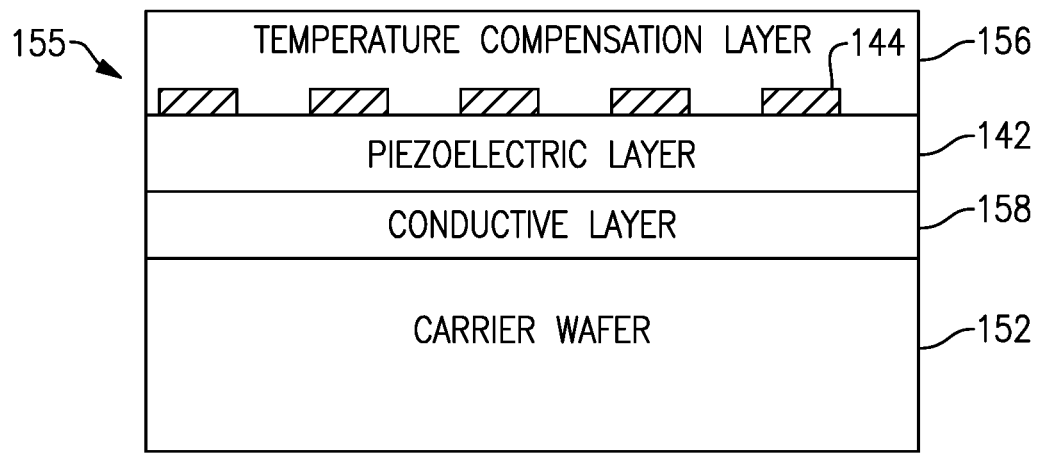
FIG. 8B is a cross sectional view of a portion of another surface acoustic wave resonator with a multi-layer piezoelectric substrate according to an embodiment.

FIG. 8B is a cross sectional view of a portion of a surface acoustic wave resonator 155 with a multi-layer piezoelectric substrate according to another embodiment. The surface acoustic wave resonator 155 can include a multi-layer piezoelectric substrate in accordance with any suitable principles and advantages disclosed herein. The surface acoustic wave resonator 155 is like the surface acoustic wave resonator 153 of FIG. 8A except that the dispersion adjustment layer 154 is not included in the multi-layer piezoelectric substrate. Instead, a temperature compensation layer 156 is included in the surface acoustic wave device 155. The illustrated temperature compensation layer 156 is positioned over the IDT electrode 144. The temperature compensation layer 156 can be a silicon dioxide layer, or any other suitable temperature compensation layer. The temperature compensation layer 156 can serve as a passivation layer, in some applications. The temperature compensation layer 156 can bring a temperature coefficient of frequency (TCF) of the surface acoustic wave resonator 155 closer to zero. For instance, the piezoelectric layer 142 can have a negative TCF and the temperature compensation layer 156 can have a positive TCF. The temperature compensation layer 156 can have an opposite TCF as a TCF of the piezoelectric layer 142.

The conductive layer 158 can be in electrical communication with a grounding structure positioned over the piezoelectric layer 142 in the surface acoustic wave resonator 155. Alternatively or additionally, the conductive layer 158 can be in electrical communication with a grounding structure positioned under the carrier substrate 152. In one aspect, at least the piezoelectric layer 142 can be etched away or etched back at one or more edges of the surface acoustic wave resonator 155 and the etched away or etched back portions can be filled with conductive material such that the conductive material is in electrical communication with the grounding structure and the conductive layer 158. In another aspect, at least one via can be formed through at least the piezoelectric layer 142 of the surface acoustic wave resonator 155 such that conductive material filling the via provides electrical communication between the grounding structure and the conductive layer 158. In some instances, the temperature compensation layer 156 can be an intervening layer between the conductive layer 142 and the grounding structure. In such cases, corresponding portions of the temperature compensation layer 156 can be etched and filled with the conductive material or the at least one via can be formed through the temperature compensation layer 156 and the piezoelectric layer 142.

Figure 8C:
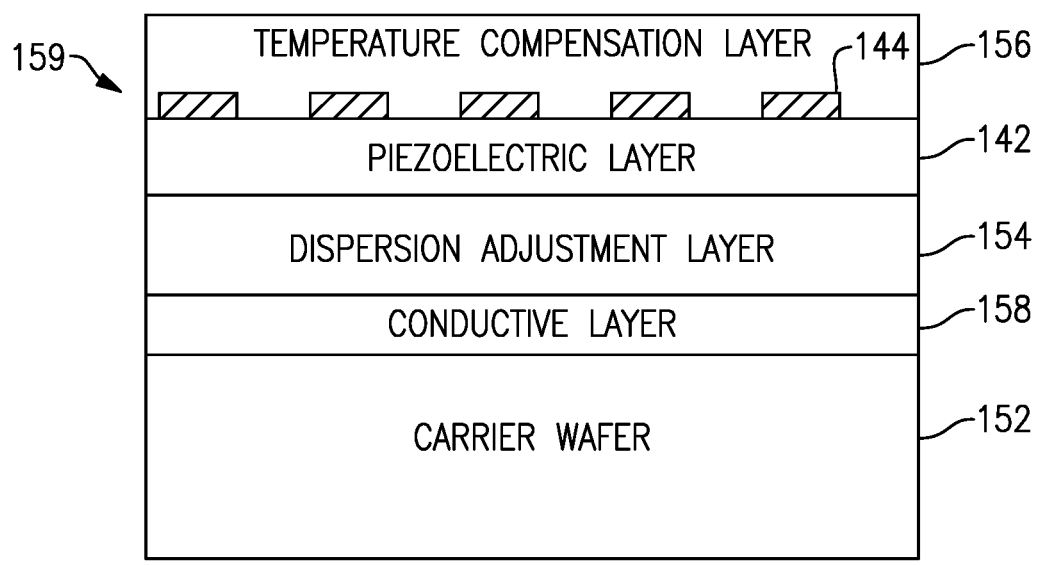
FIG. 8C is a cross sectional view of a portion of another surface acoustic wave resonator with a multi-layer piezoelectric substrate according to an embodiment.

FIG. 8C is a cross sectional view of a portion of a surface acoustic wave resonator 159 with a multi-layer piezoelectric substrate according to another embodiment. The surface acoustic wave resonator 159 is like the surface acoustic wave resonator 153 of FIG. 8A except that a temperature compensation layer 156 is included the surface acoustic wave resonator 159. The surface acoustic wave resonator 159 can include a multi-layer piezoelectric substrate in accordance with any suitable principles and advantages disclosed herein. In some instances, the dispersion adjustment layer 154 and the temperature compensation 156 can be the same material. The dispersion adjustment layer 154 and the temperature compensation 156 can be different materials in certain instances.

The conductive layer 158 can be in electrical communication with a grounding structure positioned over the piezoelectric layer 142 in the surface acoustic wave resonator 159. Alternatively or additionally, the conductive layer 158 can be in electrical communication with a grounding structure positioned under the carrier substrate 152. In one aspect, the temperature compensation layer 156, the piezoelectric layer 142, and the dispersion adjustment layer 154 can be etched away or etched back at one or more edges of the surface acoustic wave resonator 159. The etched away or etched back portions can be filled with conductive material such that the conductive material is in electrical communication with the grounding structure and the conductive layer 158. In another aspect, at least one via can be formed through the temperature compensation layer 156, the piezoelectric layer 142, and the dispersion adjustment layer 154 of the surface acoustic wave resonator 159 such that conductive material filling the via provides electrical communication between the grounding structure and the conductive layer 158.

An acoustic wave device can be manufactured in various manners. A method of manufacturing an acoustic wave device, according to an embodiment, includes providing an acoustic wave device structure. The acoustic wave structure includes a substrate, a conductive layer over the substrate, a piezoelectric layer over the conductive layer such that the conductive layer is positioned between the substrate and the piezoelectric layer, and an interdigital transducer electrode over the piezoelectric layer. The method also includes electrically connecting the conductive layer to a grounding structure that is positioned over the piezoelectric layer to thereby ground the conductive layer.

The method of manufacturing the acoustic wave device can include forming an opening through at least a portion of the piezoelectric layer to expose the conductive layer, and providing a conductive material in the opening. In some embodiments, the providing the conductive material can include forming a conductive material layer. The conductive material in the opening can provide the electrical connection between the conductive layer and the grounding structure. For example, the conductive material in the opening can define a filled via or a conformal via.

In certain embodiments, the method of manufacturing the acoustic wave device can include etching a portion of the piezoelectric layer and providing a conductive material in the etched portion of the piezoelectric layer. The conductive material in the etched portion can provide the electrical connection between the conductive layer and the grounding structure.

The method can include forming a temperature compensation layer over the interdigital transducer electrode in some embodiments.

The acoustic wave device structure can also include a dispersion adjustment layer positioned between the piezoelectric layer and the conductive layer in certain applications.

Any suitable principles and advantages disclosed herein can be implemented in any other type of acoustic wave resonator and/or acoustic wave device, such as a Lamb wave resonator or a boundary acoustic wave resonator. A Lamb wave resonator can include an IDT electrode on a piezoelectric layer and reflective gratings disposed on the piezoelectric layer on opposing sides of the IDT electrode. The reflective gratings can reflect acoustic waves induced by the IDT electrode to form a resonant cavity in such resonators. The reflective gratings can include a periodic pattern of metal on a piezoelectric layer. The Lamb wave resonators include a multi-layer piezoelectric substrate acoustic wave resonators in accordance with any suitable principles and advantages discussed herein.

Figure 9A:
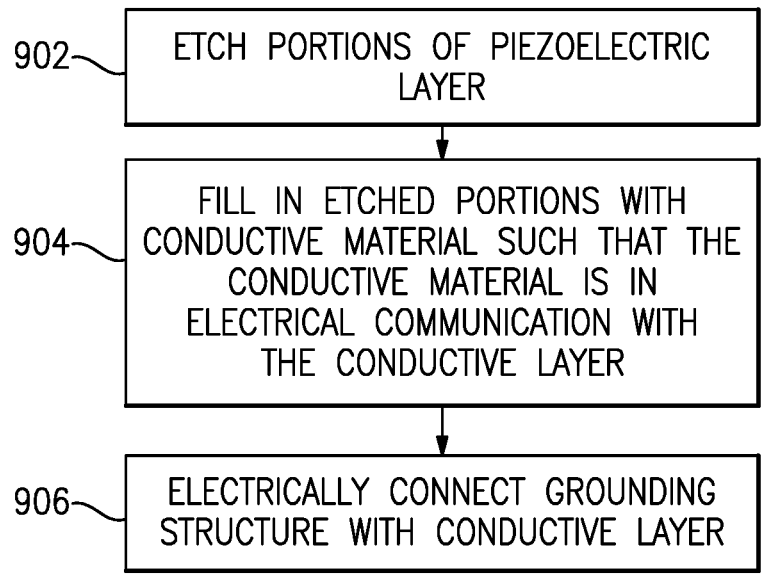
FIG. 9A is a flow chart illustrating a process to manufacture a surface acoustic wave resonator with a multi-layer piezoelectric substrate according to an embodiment.
Figure 9B:
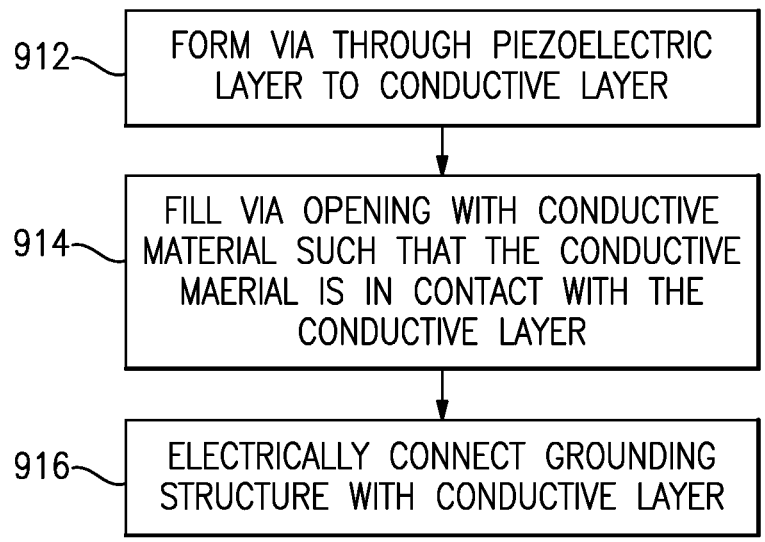
FIG. 9B is a flow chart illustrating another process to manufacture a surface acoustic wave resonator with a multi-layer piezoelectric substrate according to an embodiment.

FIGS. 9A and 9B are flow charts illustrating processes to manufacture an acoustic wave resonator with a multi-layer piezoelectric substrate according to certain embodiments. The acoustic wave resonator can include a carrier substrate, a piezoelectric layer over the carrier substrate, a conductive layer between the piezoelectric layer and the carrier substrate, an IDT electrode over the piezoelectric layer, and a grounding structure configured to provide an electrical connection to ground positioned over the piezoelectric layer. In some aspects, the acoustic wave resonator can further include a dispersion adjustment layer positioned between the piezoelectric layer and the carrier substrate or a dispersion adjustment layer over the IDT electrode. In some aspects, the acoustic wave resonator can further include two dispersion adjustment layers where a first dispersion adjustment electrode is positioned between the piezoelectric layer and the carrier substrate and a second dispersion adjustment layer is positioned over the IDT electrode. In some aspects, the acoustic wave resonator can be any of acoustic wave resonators 136, 153, 155, and 159.

FIG. 9A illustrates a process to remove portions of layers between the conductive layer and the grounding structure to expose the conductive layer. The removed portions are filled in with a conductive material as illustrated, for example, in the acoustic wave resonator 137 of FIG. 4B and the acoustic wave resonator 136 of FIG. 4A.

At operation 902, portions of at least the piezoelectric layer are removed to expose the conductive layer. In an aspect, corresponding portions of any intervening layers between the conductive layer and the grounding structure are also removed such that the conductive layer is exposed. Any suitable etching process can be used to remove the portions of the layer(s).

At operation 904, the etched portions are filled in with a conductive material such that the conductive material is in electrical communication with the conductive layer. Any suitable deposition process can be used to deposit the conductive material in the etched portions. In an aspect, the fill-in portions extend above the piezoelectric layer to the grounding structure.

At operation 906, the grounding structure is electrically connected to the filled-in conductive material such that the conductive layer is electrically connected to the grounding structure through the filled-in conductive material.

FIG. 9B illustrates a process fabricate one or more vias between the conductive layer and the grounding structure. The one or more vias are filled with a conductive material as illustrated in the acoustic wave resonator 138 of FIG. 4C.

At operation 912, a via is formed through at least the piezoelectric layer to expose the conductive layer. In an aspect, the via is formed through any intervening layers between the conductive layer and the grounding structure such that the conductive layer is exposed. For example, an opening is formed through the piezoelectric layer and any intervening layers to expose the conductive layer. Any suitable etching process can be used to form the opening.

At operation 914, the opening is filled in with conductive material such that the conductive material is in electrical communication with the conductive layer. Any suitable deposition process can be used to deposit the conductive material in the opening. In an aspect, the via extends above the piezoelectric layer to the grounding structure.

At operation 916, the grounding structure is electrically connected to the conductive material of the via such that the conductive layer is electrically connected to the grounding structure through the via.

While certain embodiments relate to acoustic wave devices with a grounding structure over a piezoelectric layer, a grounding structure can be positioned below a carrier substrate in some other embodiments. With a grounding structure positioned under the carrier substrate, one or more vias and/or other conductive structures extending through and/or along a sidewall of the carrier substrate can be included in an electrical path between a conductive layer and the grounding structure. Embodiments with a grounding structure on an opposite side of the carrier wafer than the conductive structure will be described with reference to FIGS. 10A and 10B.

Figure 10A:
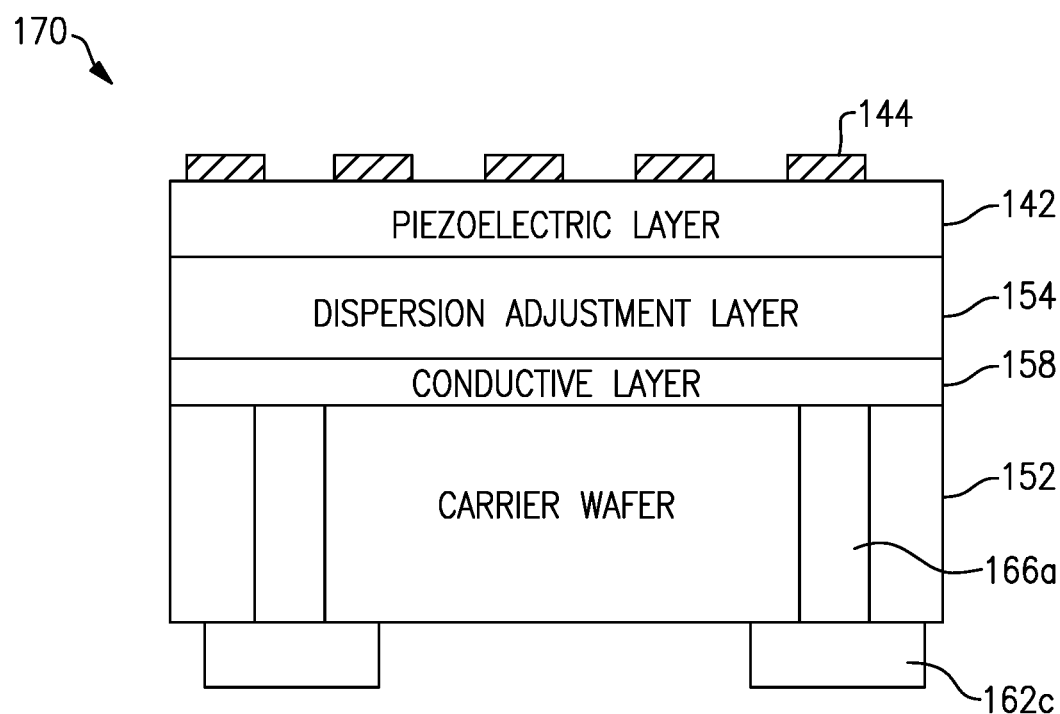
FIG. 10A is a cross sectional view of a surface acoustic wave resonator with a multi-layer piezoelectric substrate according to an embodiment.

FIG. 10A is a cross sectional view of a surface acoustic wave resonator 170 with a multi-layer piezoelectric substrate according to an embodiment. The surface acoustic wave resonator 170 includes a carrier substrate 152, a piezoelectric layer 142 over the carrier substrate 152, an IDT electrode 144 over the piezoelectric layer 142, a conductive layer 158 between the carrier substrate 152 and the piezoelectric layer 142, and a dispersion adjustment layer 154 between the piezoelectric layer 142 and the conductive layer 158. The surface acoustic resonator 170 also includes a grounding structure 162c positioned under the carrier substrate 152. As illustrated, the grounding structure 162c is on an opposite side of the carrier substrate 152 than the conductive layer 158. The grounding structure 162c is on an opposite side of the carrier substrate 152 than the piezoelectric layer 142.

The grounding structure 162c is electrically connected to the conductive layer 158 by way of a via 166a through the carrier substrate 152. The grounding structure 162c can be electrically connected to the conductive layer 158 by two or more vias 166a. The grounding structure 162c can have any structure and function of any of the grounding structures disclosed herein. For example, the grounding structure 162c can include one or more conductive pads. Alternatively, the grounding structure can include a conductive plate.

Figure 10B:
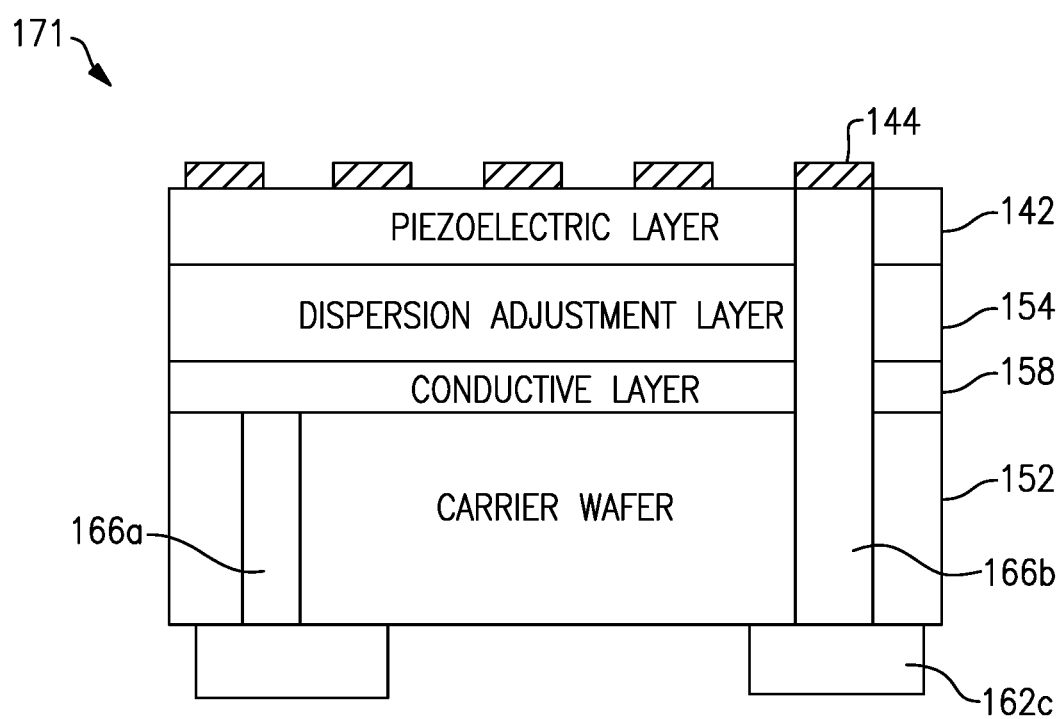
FIG. 10B is a cross sectional view of a surface acoustic wave resonator with a multi-layer piezoelectric substrate according to another embodiment.

FIG. 10B is a cross sectional view of a surface acoustic wave resonator 171 with a multi-layer piezoelectric substrate according to an embodiment. The surface acoustic wave resonator 171 can be generally similar to the surface acoustic wave resonator 170 illustrated in FIG. 10A, except that a via 166b also extends through the piezoelectric layer 142 and the dispersion adjustment layer 154. The via 166a is electrically connected with the IDT electrode 144 as illustrated. The via 166b can provide a ground connection to the IDT electrode 144. The via 166b can be aligned with conductive material of the IDT electrode 144 as illustrated. This can provide a good electrical connection between the IDT electrode 144 and ground. As illustrated, a surface acoustic wave resonator can include both the via 166a and the via 166b.

Figure 10C:
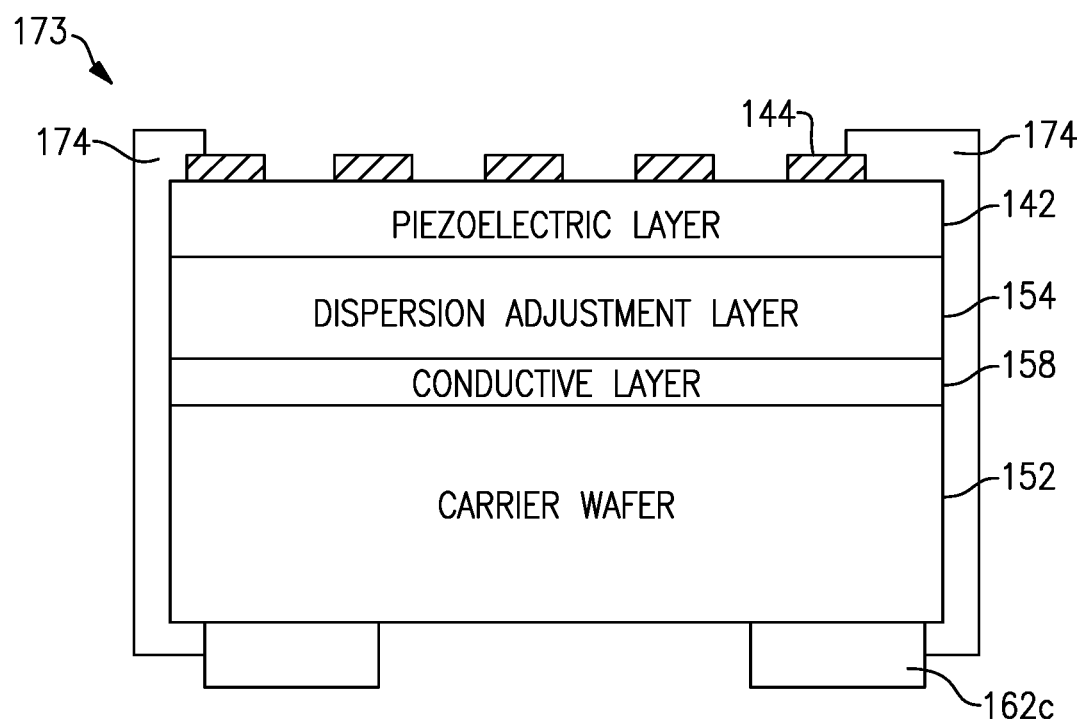
FIG. 10C is a cross sectional view of a surface acoustic wave resonator with a multi-layer piezoelectric substrate according to another embodiment.

FIG. 10C is a cross sectional view of a surface acoustic wave resonator 173 with a multi-layer piezoelectric substrate according to an embodiment. The surface acoustic wave resonator 173 includes a carrier substrate 152, a piezoelectric layer 142 over the carrier substrate 152, an IDT electrode 144 over the piezoelectric layer 142, a conductive layer 158 between the carrier substrate 152 and the piezoelectric layer 142, and a dispersion adjustment layer 154 between the piezoelectric layer 142 and the conductive layer 158. The surface acoustic resonator 173 also includes a grounding structure 162c positioned under the carrier substrate 152. As illustrated, the grounding structure 162c is on an opposite side of the carrier substrate 152 than the conductive layer 158. The grounding structure 162c is on an opposite side of the carrier substrate 152 than the piezoelectric layer 142.

The grounding structure 162c is electrically connected to the conductive layer 158 and the IDT electrode 144 by way of a conductive structure 174. A portion of the conductive structure 174 is disposed along at least a portion of a sidewall of the acoustic wave resonator 173. The conductive structure 174 can be conformally disposed along some or all of the sidewall of the acoustic wave resonator 173. The conductive structure 174 can provide a ground connection to the IDT electrode 174. In some other applications, the conductive structure 174 can provide a ground connection to one or more acoustic reflectors.

Figure 10D:
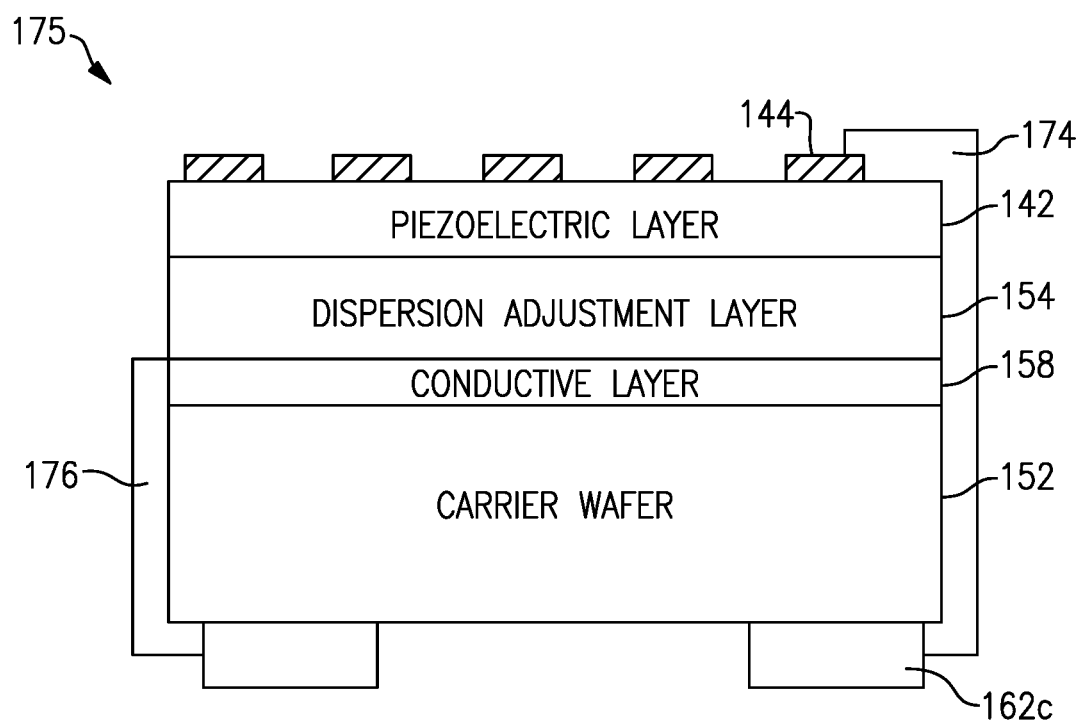
FIG. 10D is a cross sectional view of a surface acoustic wave resonator with a multi-layer piezoelectric substrate according to another embodiment.

FIG. 10D is a cross sectional view of a surface acoustic wave resonator 175 with a multi-layer piezoelectric substrate according to an embodiment. The surface acoustic wave resonator 175 is like the surface acoustic wave resonator 173, except that the surface acoustic wave resonator 175 includes a conductive structure 174 that electrically connects the grounding structure 162c to the conductive layer 158 and the IDT electrode 144 and a conductive structure 176 that electrically connects the grounding structure 162c to the conductive layer 158. In the surface acoustic wave resonator 175, the conductive structures 174 and 176 extend along different sidewalls. The conductive structure 174 extends along more layers of the surface acoustic wave resonator 175 than the conductive structure 176.

Figure 10E:
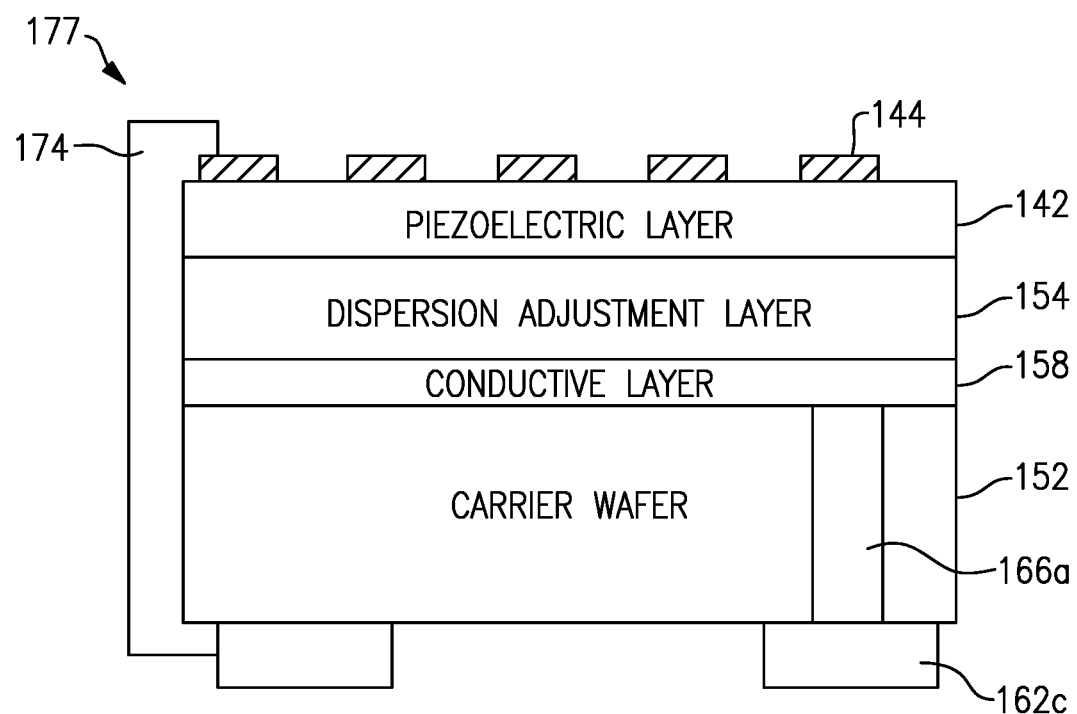
FIG. 10E is a cross sectional view of a surface acoustic wave resonator with a multi-layer piezoelectric substrate according to another embodiment.
Figure 10F:
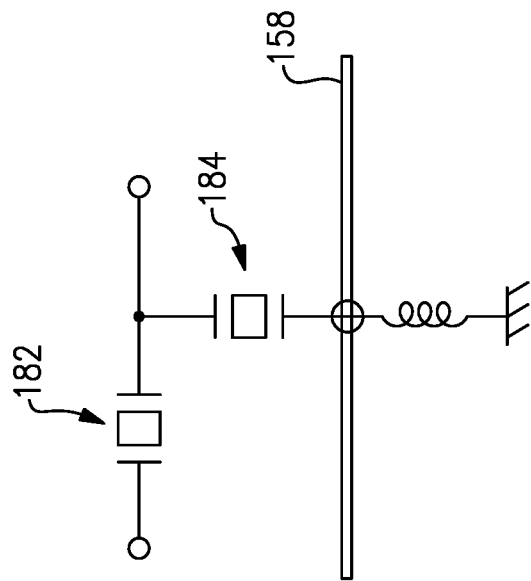
FIG. 10F is a schematic diagram of a circuit topology that includes a surface acoustic wave resonator according to an embodiment.
Figure 10G:
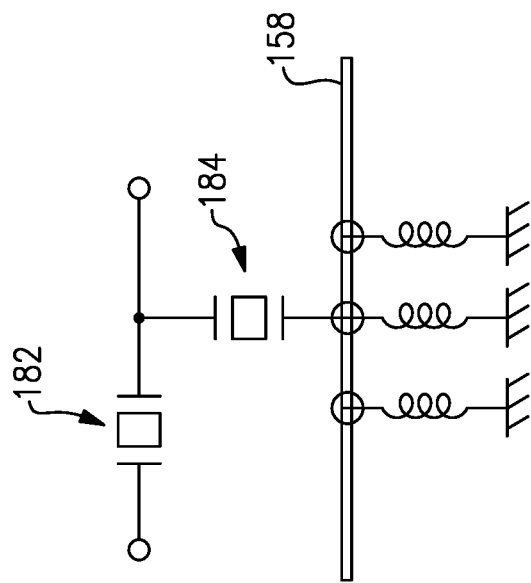
FIG. 10G is a schematic diagram of a circuit topology that includes a surface acoustic wave resonator according to another embodiment.

FIG. 10E is a cross sectional view of a surface acoustic wave resonator 177 with a multi-layer piezoelectric substrate according to an embodiment. The surface acoustic wave resonator 177 is like the surface acoustic wave resonator 173, except that the surface acoustic wave resonator 175 includes a conductive structure 174 that electrically connects the grounding structure 162c to the conductive layer 158 and the IDT electrode 144 and a via 166a that extends through the carrier substrate 152. In the surface acoustic wave resonator 177, the conductive structure 174 extends along a single sidewall, FIGS. 10F and 10G are schematic diagrams of circuit topologies that include of surface acoustic wave resonators according to two embodiments. These circuit topologies illustrate a portion of a ladder filter that includes a series resonator 182 and a shunt resonator 184. At least the shunt resonator 184 can be a multi-layer piezoelectric substrate surface acoustic wave resonator according to any embodiment disclosed herein. In FIG. 10F, there is one ground connection to the conductive layer 158. In FIG. 10G, there are three ground connections to the conductive layer 158. As illustrated, the ground connection(s) are connected to a conductive layer 158. The conductive layer 158 is electrically connected between a shunt surface acoustic wave resonator 184 and ground in FIGS. 10F and 10G. As illustrated, a shunt inductance can be between each ground connection and ground. Accordingly, one shunt inductance is illustrated in FIG. 10F and three shunt inductances are illustrated in FIG. 10G. In some embodiments, as compared to the shunt surface acoustic wave resonator illustrated in FIG. 10F, the shunt surface acoustic wave resonator illustrated in FIG. 10G can have a lower inductance associated with its connection to ground.

An acoustic wave device can be manufactured in various manners. A method of manufacturing an acoustic wave device, according to an embodiment, include providing an acoustic wave device structure. The acoustic wave device structure includes a substrate, a conductive layer over the substrate, a piezoelectric layer over the conductive layer such that the conductive layer is positioned between the substrate and the piezoelectric layer, and an interdigital transducer electrode over the piezoelectric layer. The method of manufacturing an acoustic wave device also includes electrically connecting the conductive layer to a grounding structure under the substrate. The substrate is positioned between the conductive layer and the grounding structure.

In some embodiments, the method can also include forming an opening through at least a portion of the substrate and providing a conductive material in the opening. The conductive material in the opening can provide electrical connection between the conductive layer and the grounding structure. The conductive material in the opening can define a via extending through the substrate.

In certain embodiments, the method of manufacturing an acoustic wave device can also include forming a temperature compensation layer over the interdigital transducer electrode.

The acoustic wave device structure can include a dispersion adjustment layer positioned between the piezoelectric layer and the conductive layer in some embodiments.

In certain embodiments, the grounding structure and the interdigital transducer electrode can be electrically connected by electrically connecting. In some such embodiments, after the electrically connecting, a first via extends from the grounding structure to the conductive structure and a second via extends from the grounding structure through the conductive layer to the interdigital transducer electrode. Therefore the electrically connecting can provide a ground connection to the conductive structure.

An acoustic wave device including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more SAW devices disclosed herein. FR1 can be from 410 MHz to 7.125 GHz, for example, as specified in a current 5G NR specification. An acoustic wave device with a grounded conductive layer in a multi-layer piezoelectric substrate can improve isolation between ports of an acoustic wave device that includes the acoustic wave device. Such improved isolation can be desirable for 5G NR applications.

One or more SAW devices in accordance with any suitable principles and advantages disclosed herein can be included in a filter arranged to filter a radio frequency signal in a 4G LTE operating band. One or more SAW devices in accordance with any suitable principles and advantages disclosed herein can be included in a filter arranged to filter a radio frequency signal in a filter having a passband that includes a 4G LTE operating band and a 5G NR operating band.

Figure 11:
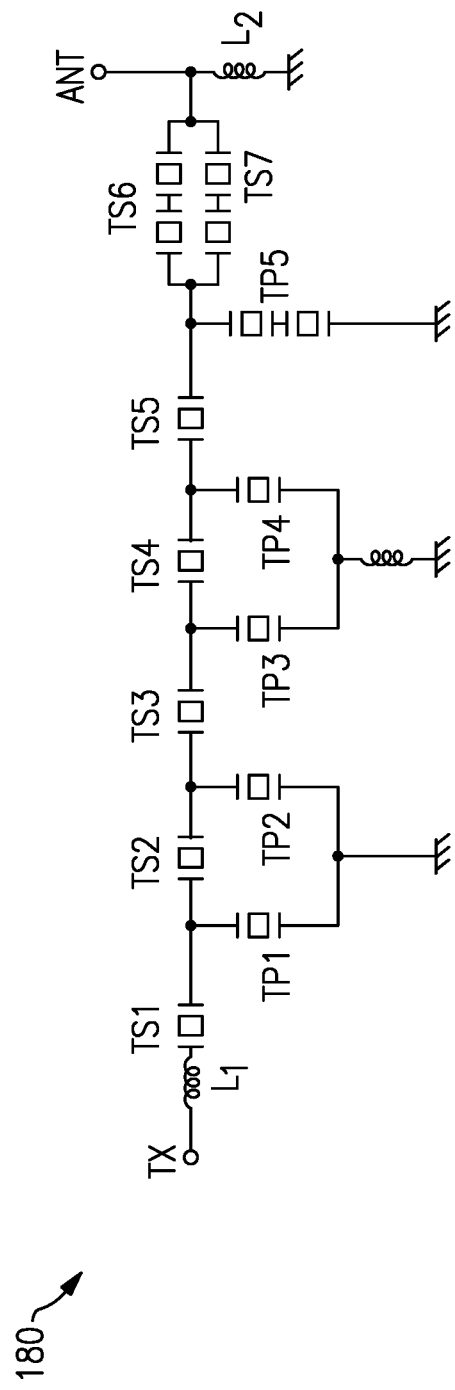
FIG. 11 is a schematic diagram of a transmit filter that includes an acoustic wave resonator according to an embodiment.

FIG. 11 is a schematic diagram of an example transmit filter 180 that includes acoustic wave resonators according to an embodiment. The transmit filter 180 can be a band pass filter. The illustrated transmit filter 180 is arranged to filter a radio frequency signal received at a transmit port TX and provide a filtered output signal to an antenna port ANT. The transmit filter 180 includes series SAW resonators TS1, TS2, TS3, TS4, TS5, TS6, and TS7, shunt SAW resonators TP1, TP2, TP3, TP4, and TP5, series input inductor L1, and shunt inductor L2. Some or all of the acoustic wave resonators TS1 to TS7 and/or TP1 to TP5 can be multi-layer piezoelectric substrate acoustic wave resonators in accordance with any suitable principles and advantages disclosed herein. Some or all of the acoustic wave resonators TS1 to TS7 and/or TP1 to TP5 can be surface acoustic wave resonators in accordance with any suitable principles and advantages disclosed herein. Any suitable number of series acoustic wave resonators and shunt acoustic wave resonators can be included in a transmit filter 180. Such acoustic wave resonators can be surface acoustic wave resonators having a multi-layer piezoelectric substrate that includes a dispersion adjustment layer in accordance with any suitable principles and advantages disclosed herein.

Figure 12:
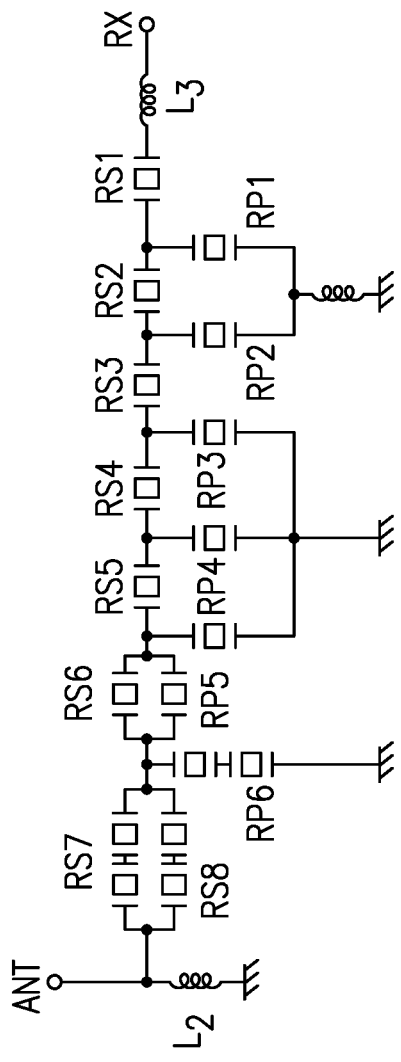
FIG. 12 is a schematic diagram of a receive filter that includes an acoustic wave resonator according to an embodiment.

FIG. 12 is a schematic diagram of a receive filter 190 that includes acoustic wave resonators according to an embodiment. The receive filter 190 can be a band pass filter. The illustrated receive filter 190 is arranged to filter a radio frequency signal received at an antenna port ANT and provide a filtered output signal to a receive port RX. The receive filter 180 includes series SAW resonators RS1, RS2, RS3, RS4, RS5, RS6, RS7, and RS8, shunt SAW resonators RP1, RP2, RP3, RP4, and RP5, and RP6, shunt inductor L2, and series output inductor L3. Some or all of the acoustic wave resonators RS1 to RS8 and/or RP1 to RP6 can be multi-layer piezoelectric substrate acoustic wave resonators in accordance with any suitable principles and advantages disclosed herein. Some or all of the acoustic wave resonators RS1 to RS8 and/or RP1 to RP6 can be surface acoustic wave in accordance with any suitable principles and advantages disclosed herein. Any suitable number of series acoustic wave resonators and shunt acoustic wave resonators can be included in a receive filter 190. Such acoustic wave resonators can be surface acoustic wave resonators having a multi-layer piezoelectric substrate that includes a dispersion adjustment layer in accordance with any suitable principles and advantages disclosed herein.

Figure 13:
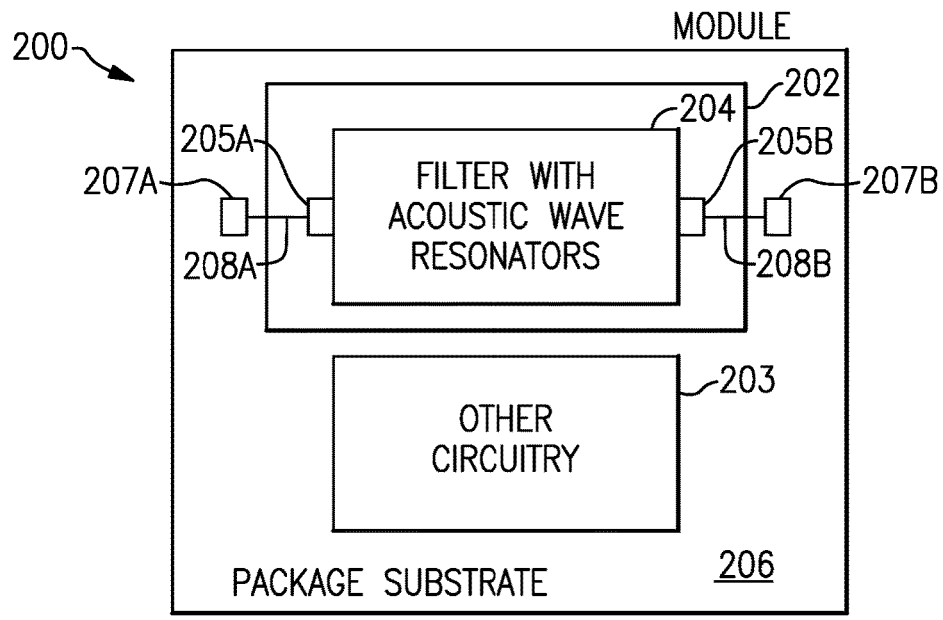
FIG. 13 is a schematic diagram of a radio frequency module that includes an acoustic wave device according to an embodiment.

FIG. 13 is a schematic diagram of a radio frequency module 200 that includes an acoustic wave component 202 according to an embodiment. The illustrated radio frequency module 200 includes the acoustic wave component 202 and other circuitry 203. The acoustic wave component 202 can include one or more multi-layer piezoelectric substrate acoustic wave resonators with any suitable combination of features of the acoustic wave resonators disclosed herein. The acoustic wave component 202 can include an acoustic wave die that includes acoustic wave resonators. For example, the acoustic wave component 202 can include a SAW die that includes SAW resonators.

The acoustic wave component 202 shown in FIG. 13 includes a filter 204 and terminals 205A and 205B. The filter 204 includes acoustic wave resonators. One or more of the acoustic wave resonators can be implemented in accordance with any suitable principles and advantages of the multi-layer piezoelectric substrate acoustic wave resonators disclosed herein. The terminals 205A and 205B can serve, for example, as an input contact and an output contact. The acoustic wave component 202 and the other circuitry 203 are on a common packaging substrate 206 in FIG. 13. The package substrate 206 can be a laminate substrate. The terminals 205A and 205B can be electrically connected to contacts 207A and 207B, respectively, on the packaging substrate 206 by way of electrical connectors 208A and 208B, respectively. The electrical connectors 208A and 208B can be bumps or wire bonds, for example.

The other circuitry 203 can include any suitable additional circuitry. For example, the other circuitry can include one or more power amplifiers, one or more radio frequency switches, one or more additional filters, one or more low noise amplifiers, one or more RF couplers, one or more delay lines, one or more phase shifters, the like, or any suitable combination thereof. The radio frequency module 200 can include one or more packaging structures to, for example, provide protection and/or facilitate easier handling of the radio frequency module 200. Such a packaging structure can include an overmold structure formed over the packaging substrate 200. The overmold structure can encapsulate some or all of the components of the radio frequency module 200.

Figure 14:
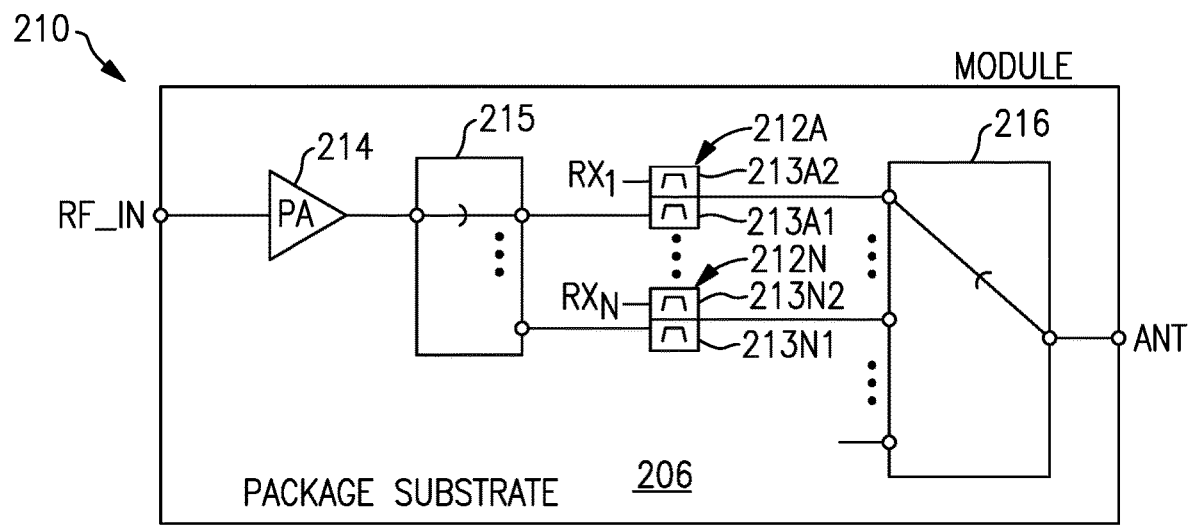
FIG. 14 is a schematic diagram of a radio frequency module that includes an acoustic wave component according to an embodiment.

FIG. 14 is a schematic diagram of a radio frequency module 210 that includes an acoustic wave component according to an embodiment. As illustrated, the radio frequency module 210 includes duplexers 212A to 212N that include respective transmit filters 213A1 to 213N1 and respective receive filters 213A2 to 213N2, a power amplifier 214, a select switch 215, and an antenna switch 216. The radio frequency module 210 can include a package that encloses the illustrated elements. The illustrated elements can be disposed on a common packaging substrate 206. The packaging substrate 206 can be a laminate substrate, for example. A radio frequency module that includes a power amplifier can be referred to as a power amplifier module. A radio frequency module can include a subset of the elements illustrated in FIG. 14 and/or additional elements.

The duplexers 212A to 212N can each include two acoustic wave filters coupled to a common node. The two acoustic wave filters can be a transmit filter and a receive filter. As illustrated, the transmit filter and the receive filter can each be a band pass filter arranged to filter a radio frequency signal. One or more of the transmit filters 213A1 to 213N1 can include one or more multi-layer piezoelectric substrate acoustic wave resonators in accordance with any suitable principles and advantages disclosed herein. Similarly, one or more of the receive filters 213A2 to 213N2 can include one or more multi-layer piezoelectric substrate acoustic wave resonators in accordance with any suitable principles and advantages disclosed herein. Although FIG. 14 illustrates duplexers, any suitable principles and advantages disclosed herein can be implemented in other multiplexers (e.g., quadplexers, hexaplexers, octoplexers, etc.) and/or in switch-plexers.

The power amplifier 214 can amplify a radio frequency signal. The illustrated switch 215 is a multi-throw radio frequency switch. The switch 215 can electrically couple an output of the power amplifier 214 to a selected transmit filter of the transmit filters 213A1 to 213N1. In some instances, the switch 215 can electrically connect the output of the power amplifier 214 to more than one of the transmit filters 213A1 to 213N1. The antenna switch 216 can selectively couple a signal from one or more of the duplexers 212A to 212N to an antenna port ANT. The duplexers 212A to 212N can be associated with different frequency bands and/or different modes of operation (e.g., different power modes, different signaling modes, etc.).

Figure 15A:
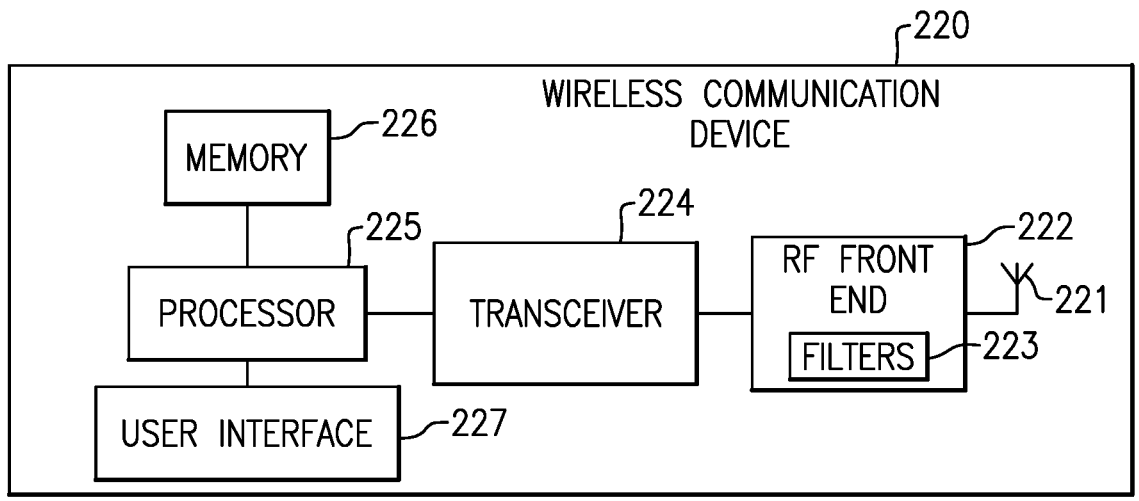
FIG. 15A is a schematic block diagram of a wireless communication device that includes a filter in accordance with one or more embodiments.

FIG. 15A is a schematic diagram of a wireless communication 220 device that includes filters 223 in a radio frequency front end 222 according to an embodiment. The filters 223 can include one or more multi-layer piezoelectric substrate acoustic wave resonators in accordance with any suitable principles and advantages discussed herein. The wireless communication device 220 can be any suitable wireless communication device. For instance, a wireless communication device 220 can be a mobile phone, such as a smart phone. As illustrated, the wireless communication device 220 includes an antenna 221, an RF front end 222, a transceiver 224, a processor 225, a memory 226, and a user interface 227. The antenna 221 can transmit RF signals provided by the RF front end 222. Such RF signals can include carrier aggregation signals. The antenna 221 can receive RF signals and provide the received RF signals to the RF front end 222 for processing.

The RF front end 222 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards. The filters 223 can include one or more multi-layer piezoelectric substrate acoustic wave resonators that include any suitable combination of features discussed with reference to any embodiments discussed above.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Figure 15B:
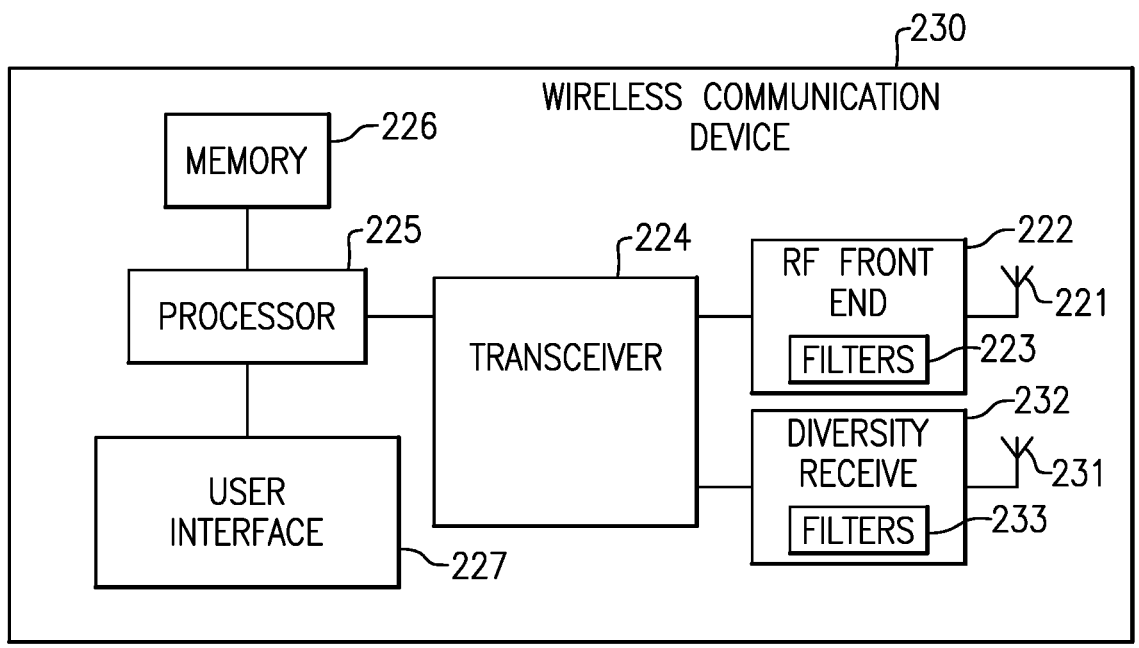
FIG. 15B is a schematic block diagram of another wireless communication device that includes a filter in accordance with one or more embodiments.

FIG. 15B is a schematic diagram of a wireless communication device 230 that includes filters 223 in a radio frequency front end 222 and second filters 233 in a diversity receive module 232. The wireless communication device 230 is like the wireless communication device 220 of FIG. 15A, except that the wireless communication device 230 also includes diversity receive features. As illustrated in FIG. 15B, the wireless communication device 230 includes a diversity antenna 231, a diversity module 232 configured to process signals received by the diversity antenna 231 and including filters 233, and a transceiver 234 in communication with both the radio frequency front end 222 and the diversity receive module 232. The filters 233 can include one or more multi-layer piezoelectric substrate acoustic wave resonators that include any suitable combination of features discussed with reference to any embodiments discussed above.

Although embodiments are discussed with reference to certain acoustic wave resonators, any suitable principles and advantages disclosed herein can be applied to any other suitable acoustic wave resonators, such as boundary acoustic wave resonators or Lamb wave resonators.

Any of the embodiments described above can be implemented in mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kHz to 300 GHz, such as a frequency in a range from about 450 MHz to 8.5 GHz.

Aspects of this disclosure can be implemented in various electronic devices. Examples of the electronic devices can include, but are not limited to, consumer electronic products, parts of the consumer electronic products such as die and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave resonator comprising:
   a piezoelectric layer over a substrate, the piezoelectric layer having at least one etched portion along a side;
   an interdigital transducer electrode over the piezoelectric layer;
   a grounding structure over at least a portion of the interdigital transducer electrode; and
   a conductive layer with at least a portion positioned between the interdigital transducer electrode and the substrate, the conductive layer electrically connected to the grounding structure by way of conductive material in the at least one etched portion of the piezoelectric layer.

2. The acoustic wave resonator of claim 1 further comprising the at least one etched portion on one or more back portions of the piezoelectric layer.

3. The acoustic wave resonator of claim 1 wherein the acoustic wave resonator is a surface acoustic wave resonator configured to generate a surface acoustic wave.

4. The acoustic wave resonator of claim 1 further comprising a dispersion adjustment layer between the piezoelectric layer and the conductive layer.

5. The acoustic wave resonator of claim 4 wherein the dispersion adjustment layer includes silicon dioxide.

6. The acoustic wave resonator of claim 4 further comprising a second dispersion adjustment layer disposed over the interdigital transducer electrode.

7. The acoustic wave resonator of claim 1 further comprising a temperature compensation layer disposed over the interdigital transducer electrode.

8. The acoustic wave resonator of claim 1 wherein the grounding structure includes a plurality of grounding structure portions that are spaced apart from each other.

9. The acoustic wave resonator of claim 1 wherein the conductive layer has a thickness of between approximately 10 nanometers and approximately 10 microns.

10. The acoustic wave resonator of claim 1 wherein the grounding structure includes conductive pillars.

11. A method of manufacturing an acoustic wave resonator, the method comprising:
    etching at least one etched portion along a side of a piezoelectric layer of an acoustic wave resonator, the piezoelectric layer positioned above a conductive layer and a substrate;
    filling the at least one etched portion with conductive material and electrically connecting the conductive material to the conductive layer;
    disposing an interdigital transducer electrode above the piezoelectric layer, the conductive layer positioned between the interdigital electrode and the substrate; and
    electrically connecting the conductive material to a grounding structure, the grounding structure positioned over the interdigital transducer electrode.

12. The method of claim 11 further comprising disposing a temperature compensation layer over the interdigital transducer electrode.

13. The method of claim 11 wherein etching at least one etched portion of the piezoelectric layer includes etching back portions of the piezoelectric layer.

14. The method of claim 11 wherein the acoustic wave resonator is a surface acoustic wave resonator configured to generate a surface acoustic wave.

15. The method of claim 11 further comprising etching corresponding portions of a dispersion adjustment layer disposed between the piezoelectric layer and the conductive layer and filling the corresponding etched portions of the dispersion adjustment layer with the conductive material.

16. The method of claim 15 wherein the dispersion adjustment layer includes silicon dioxide.

17. The method of claim 15 further comprising disposing a second dispersion adjustment layer over the interdigital transducer electrode.

18. The method of claim 11 wherein the grounding structure includes a plurality of grounding structure portions that are spaced apart from each other.

19. The method of claim 11 wherein the conductive layer has a thickness of between approximately 10 nanometers and approximately 10 microns.

20. The method of claim 11 wherein the grounding structure includes conductive pillars.

\* \* \* \* \*